US009087911B2

(12) United States Patent
Alexandrov et al.

(10) Patent No.: US 9,087,911 B2
(45) Date of Patent: Jul. 21, 2015

(54) TRENCH SHIELD CONNECTED JFET

(71) Applicant: United Silicon Carbide, Inc., Monmouth Junction, NJ (US)

(72) Inventors: Peter Alexandrov, Piscataway, NJ (US); Anup Bhalla, Princeton Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 14/298,394

(22) Filed: Jun. 6, 2014

(65) Prior Publication Data

US 2014/0361349 A1    Dec. 11, 2014

Related U.S. Application Data

(60) Provisional application No. 61/831,906, filed on Jun. 6, 2013, provisional application No. 61/833,217, filed on Jun. 10, 2013.

(51) Int. Cl.
*H01L 29/808* (2006.01)
*H01L 29/66* (2006.01)
*H01L 29/06* (2006.01)
*H01L 29/10* (2006.01)

(52) U.S. Cl.
CPC ........ *H01L 29/8083* (2013.01); *H01L 29/0619* (2013.01); *H01L 29/1066* (2013.01); *H01L 29/66909* (2013.01); *H01L 2924/13062* (2013.01)

(58) Field of Classification Search
CPC ............... H01L 29/66893–29/66924; H01L 29/808–29/8083; H01L 2924/13062
See application file for complete search history.

(56) References Cited

U.S. PATENT DOCUMENTS

| | | | |
|---|---|---|---|
| 4,587,712 A | 5/1986 | Baliga | |
| 5,702,987 A * | 12/1997 | Chen et al. | 438/187 |
| 6,653,666 B2 | 11/2003 | Mitlehner et al. | |
| 7,005,678 B2 | 2/2006 | Kumar et al. | |
| 7,230,275 B2 | 6/2007 | Kumar et al. | |
| 7,479,672 B2 | 1/2009 | Zhao | |
| 7,691,694 B2 | 4/2010 | Kumar et al. | |
| 7,977,713 B2 | 7/2011 | Sankin et al. | |
| 8,058,655 B2 | 11/2011 | Sheridan et al. | |
| 8,202,772 B2 | 6/2012 | Sheridan et al. | |
| 2005/0167695 A1 | 8/2005 | Yilmaz | |
| 2007/0037327 A1 | 2/2007 | Herrick et al. | |
| 2008/0035987 A1 | 2/2008 | Hebert | |
| 2008/0308838 A1 | 12/2008 | McNutt et al. | |
| 2010/0244126 A1 | 9/2010 | Purtell et al. | |
| 2011/0169103 A1 | 7/2011 | Darwish et al. | |
| 2015/0076568 A1 * | 3/2015 | Siemieniec et al. | 257/263 |

* cited by examiner

*Primary Examiner* — Steven J Fulk
*Assistant Examiner* — Eric Ward
(74) *Attorney, Agent, or Firm* — Baker & Hostetler LLP

(57) ABSTRACT

A shielded junction field effect transistor (JFET) is described having gate trenches and shield trenches, the shield trenches being deeper and narrower than the gate trenches. The gate trenches may be fully aligned, partially aligned, or separated from the shield trenches.

23 Claims, 35 Drawing Sheets

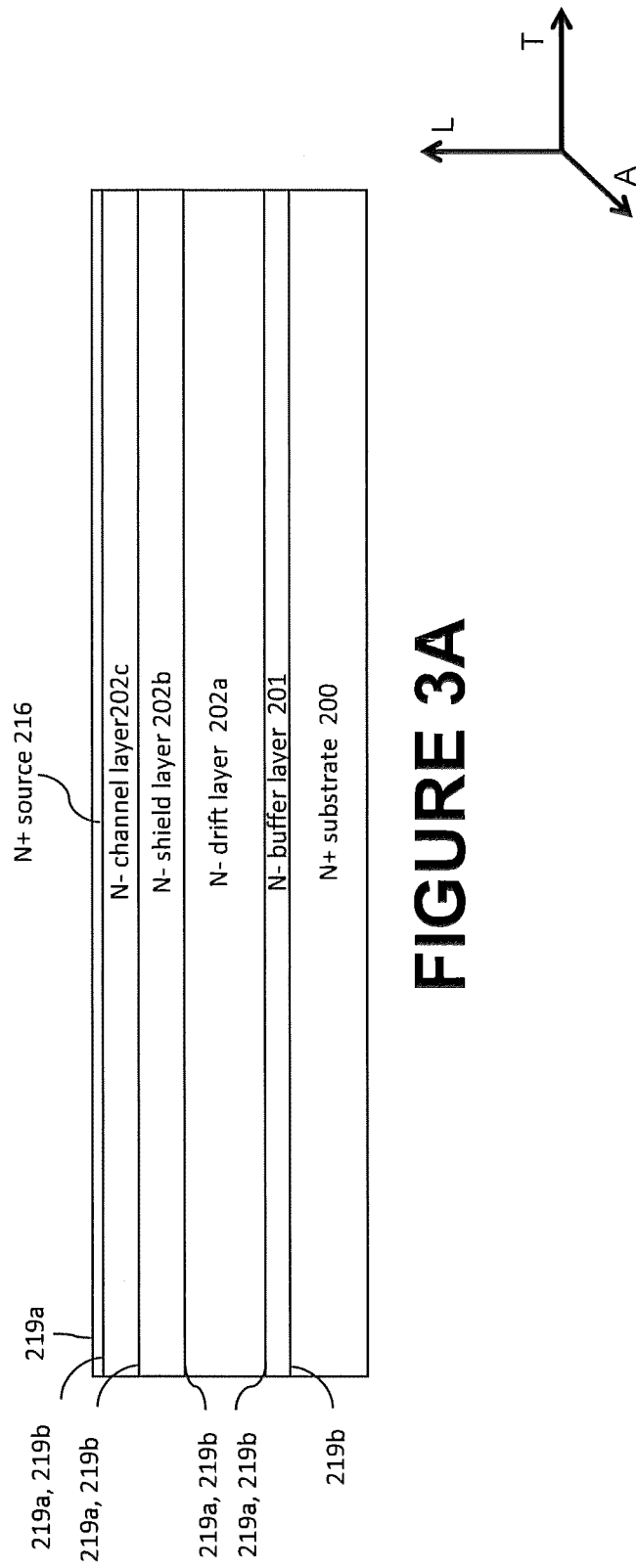

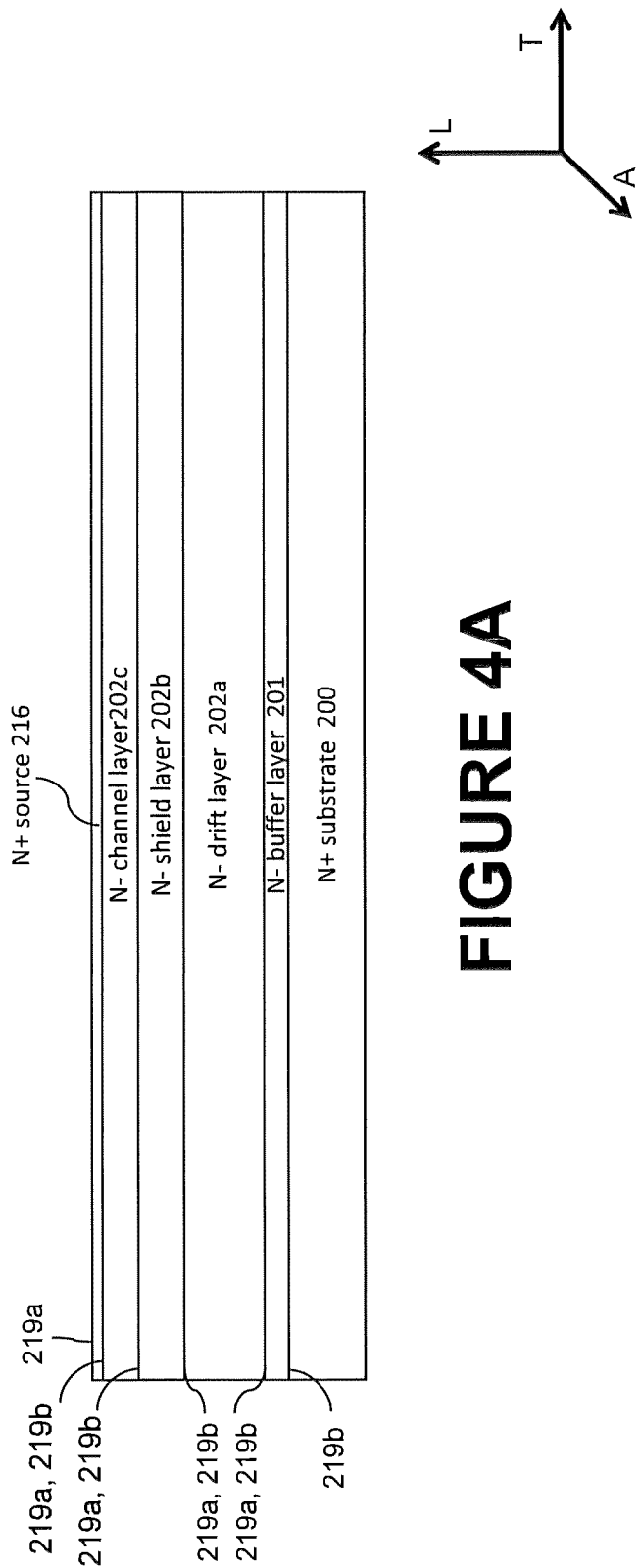

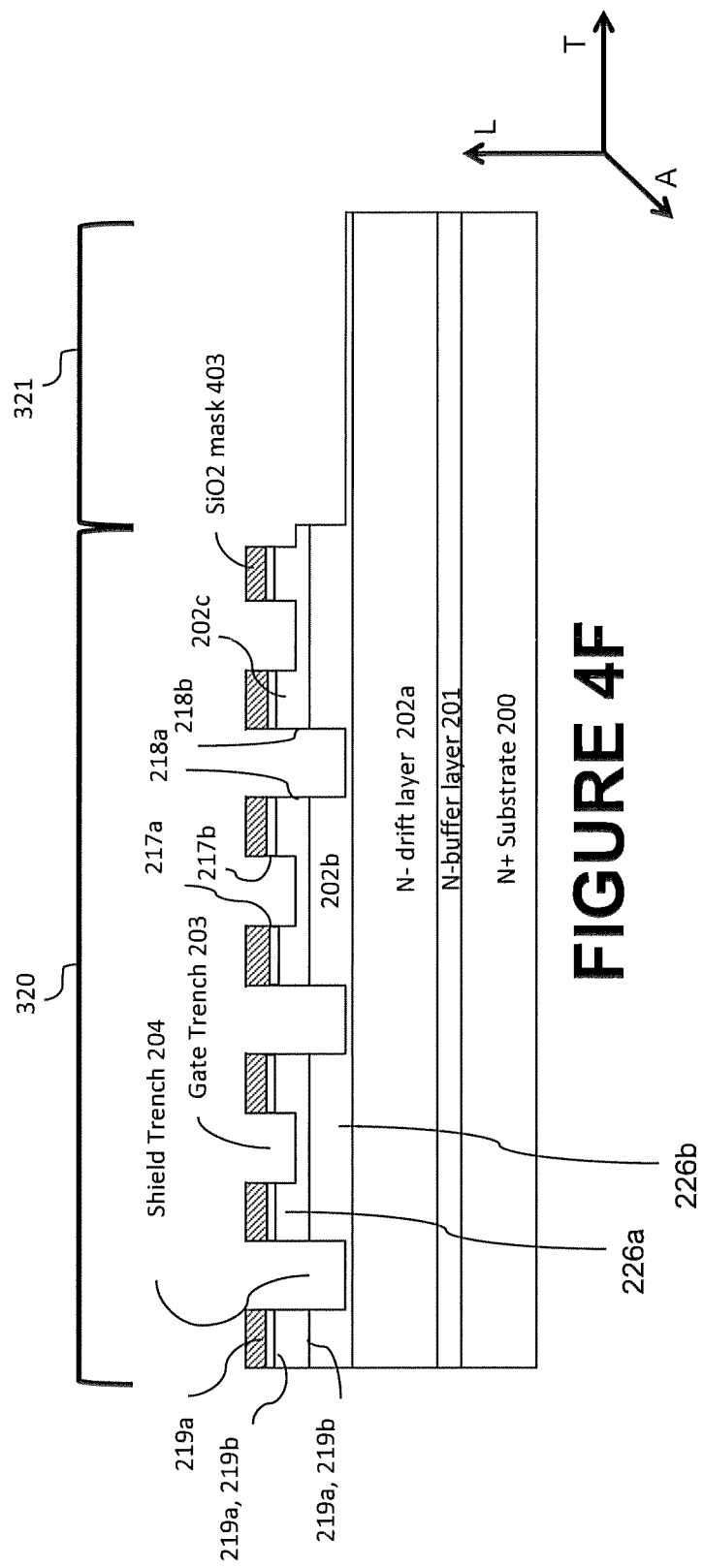

TRENCH SHIELD CONNECTED JFET

CROSS REFERENCE TO RELATED APPLICATIONS

This application claims the benefit of U.S. Provisional Patent Application Ser. No. 61/831,906 filed Jun. 6, 2013 and U.S. Provisional Patent Application Ser. No. 61/833,217 filed Jun. 10, 2013 the disclosures of which are hereby incorporated by reference as if set forth in their entirety herein.

FIELD OF THE DISCLOSURE

The present disclosure relates to the field of high-current and high-voltage semiconductor devices, such as normally-on and normally-off vertical junction field effect transistors (VJFETs) and the methods of making the same.

BACKGROUND

High voltage vertical junction field effect transistors (VJFETs) built on Silicon Carbide (SiC) and other wide bandgap materials are of great interest for high power conversion applications due to their superior performance compared to similar devices built on Silicon (Si). Wide bandgap semiconductors have higher breakdown fields than Si that allows the use of thinner and more highly doped voltage supporting drift regions. This may directly result in many orders of magnitude reduction in device resistance in the on-state compared to a Silicon device of the same voltage rating.

VJFETs are unipolar devices since they use majority carriers and usually do not suffer from the problems related to minority carrier storage. VJFETs typically offer faster switching speeds and reduced switching losses. This allows for more compact power electronic circuits by reducing the size of the passive and cooling components. For unipolar devices the switching speed may be determined by the device capacitances. In hard-switched applications, such as most inductive loads like motors, low gate-drain capacitance ($C_{GD}$) is critical for fast device performance.

SUMMARY

In accordance with the present invention, a shielded junction field effect transistors (JFET), and method of making the same, is shown and described. The shielded JFET may include a source contact, a channel area, a first trench, a gate contact, a second trench, and a shield contact.

The channel area of a first conductivity type may be disposed below the source electrode along a first direction, the channel area comprising one or more planar layers of the first conductivity type, the channel area having an upper planar surface and a lower planar surface spaced apart along the first direction.

The first trench, the first trench may have: a first bottom surface located in between the upper planar surface and the lower planar surface along the first direction, the first bottom surface extending along the first direction, a first depth that extends a first distance into the channel area from the upper planar surface of the channel layer towards the first bottom surface along the first direction, a first center line, a first pair of side walls spaced apart from one another along a second direction that is perpendicular to the first direction, the first pair of side walls extending from the first bottom surface of the first trench to the upper planar surface of the channel area; a first implanted U-shaped conductivity region of the second conductivity type in the channel area comprising: (1) a first portion extending along the bottom surface of the first trench; and (2) a second portion extending from the first bottom surface of the first trench to the upper planar surface of the channel area along each of the pair of side walls. The gate contact may be disposed in the first trench and adjacent to the first bottom surface of the first trench.

The second trench, the second trench may have second bottom surface located in between the upper planar surface and the lower planar surface along the first direction, the first bottom surface extending along the first direction, a second depth that extends a second distance into the channel area from the upper planar surface of the channel layer towards the second bottom surface along the first direction, the second depth being greater than the first depth, a second center line, a second pair of side walls spaced apart from one another along the second direction, the second pair of side walls extending (1) from the second bottom surface of the first trench towards the upper planar surface of the channel area and (2) at least partially between the second bottom surface of the second trench and the upper planar surface of the channel area; a second implanted U-shaped conductivity region of the second conductivity type in the channel area comprising: (1) a first portion extending along the second bottom surface of the second U-shaped trench; (2) a second portion extending at least partially between the second bottom surface of the second trench and the upper planar surface of the channel area along each of the second pair of side walls. The shield contact may be adjacent to the second bottom surface of the second trench.

BRIEF DESCRIPTION OF THE DRAWINGS

FIGS. 3A-3K illustrate a process for making a shielded vertical JFET, where the center of the shield trench is aligned with the center of the gate trench, and the shield trench is connected to the source or the gate potential.

FIGS. 4A-4M illustrate processes for making a shielded vertical JFET, where the center of the shield trench is not aligned with the center of the gate trench, and the shield trench is connected to the source or the gate potential.

DETAILED DESCRIPTION

Figure 1A:
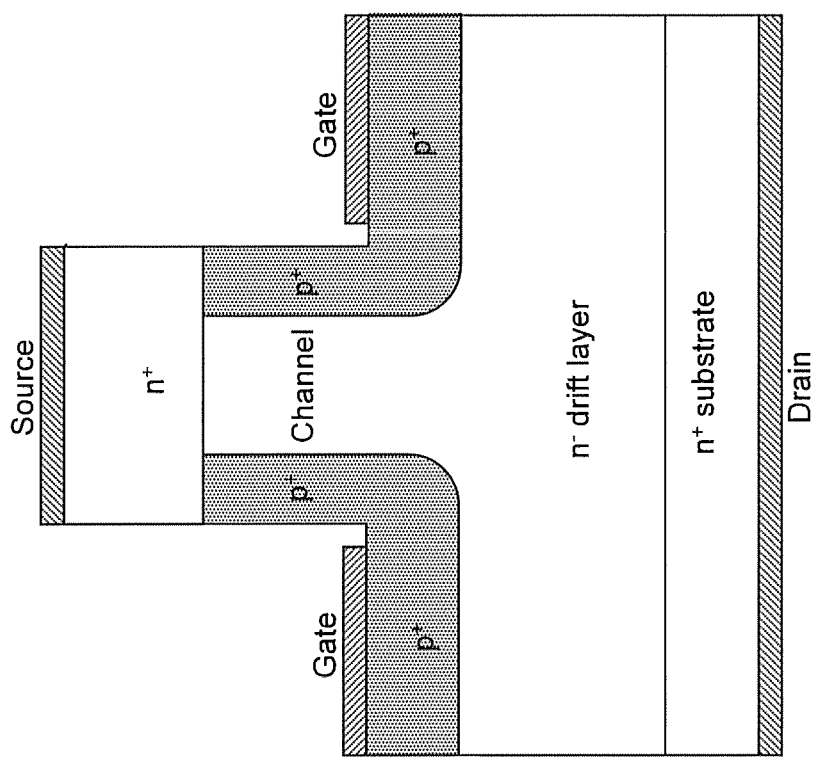
FIGS. 1A-1B illustrate prior art of vertical JFET.

The present disclosure may be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular embodiments by way of example only and is not intended to be limiting of the claimed embodiments. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the disclosure which are, for clarity, described herein in the context of separate embodiments, may also be provided in combination in a single embodiment. Conversely, various features of the disclosure that are, for brevity, described in the context of a single embodiment, may also be provided separately or in any sub combination. Further, reference to values stated in ranges include each and every value within that range. As shown and described herein, common reference numbers used to describe or label features of the various embodiment are intended to denote the same or similar features.

Compared to the other type of unipolar power switching device, such as the MOSFET, the VJFET may offer advantages for high power and high temperature applications. A critical characteristic of a MOSFET device is the quality of the semiconductor-oxide interface. In SiC, this interface may contain high density of carbon related surface states, which results in low electron mobility at the channel surface. VJFETs usually have a bulk channel instead of an inversion layer, so they may be fabricated with a lower on-resistance than a MOSFET of comparable voltage rating. The reliability of SiC MOSFETs at high temperatures and high electric field is a concern. An intrinsic disadvantage of SiC compared to Si for MOSFET applications is the smaller conduction band discontinuity for the SiC-oxide interface compared to Si-oxide. Moreover if the higher breakdown filed of SiC is to be utilized, the oxide would be subjected to an even larger stress. This could lead to threshold voltage instability, due to carrier trapping in the gate oxide, and premature oxide breakdown, especially at high temperatures. VJFETs on the other hand are free of gate oxide and use only p-n junctions in the active device area where high electric field stress occurs and so are not subject to oxide related reliability issues. Therefore JFETs can fully exploit the high temperature capability of SiC in a voltage controlled switching device.

Devices built on SiC and other wide-band gap materials offer performance advantages, however the material is more expensive than Si. Therefore device structures that can decrease the die size are helpful to make the devices more cost-effective and allow for their widespread application.

In a conventional VJFET, the vertical channel needs to provide high potential barrier for high voltage blocking while at the same time offer low on-resistance, which are two conflicting requirements. In order to reduce the drain induced barrier lowering effect when a high drain voltage is applied, and provide high blocking voltage and reasonable on-resistance, the channel needs to be designed with a certain minimum length to width ratio for a given doping. In a trenched and implanted structure making narrow and long vertical trenches is a more challenging processing task, as etching deep, narrow and closely spaced trenches with a well-controlled vertical profile is more difficult, and process non-uniformity has a greater effect on the vertical channel region width (mesa width) variation as the critical dimensions shrink. Also, doping the sidewalls of very deep trenches by ion implantation becomes a limiting factor, due to a shadowing effects from the tall mesas formed. For a given channel doping and width, a shorter vertical channel designs can provide better on-resistance if the electric field at the lower end of the channel can be reduced.

A pure vertical channel type structure provides the lowest device on-resistance. A trenched and implanted VJFET (TIVFET) of FIG. 1A is an example of a pure vertical channel type structure. However, the main disadvantage of this structure is its high gate-drain capacitance $C_{GD}$ that limits the device speed. In order to reduce $C_{GD}$, different structures have been employed, such as the type of JFET shown in FIG. 1B, that utilizes a shield region 100 connected to the source. These structures reduce $C_{GD}$, but this comes at the expense of increased on-resistance, as they create an additional lateral channel element that adds to the device on-resistance. Further, both structures of FIGS. 1A and 1B require epi regrowth. But the long lateral channel makes for a high specific on-resistance RdsA.

Figure 1B:
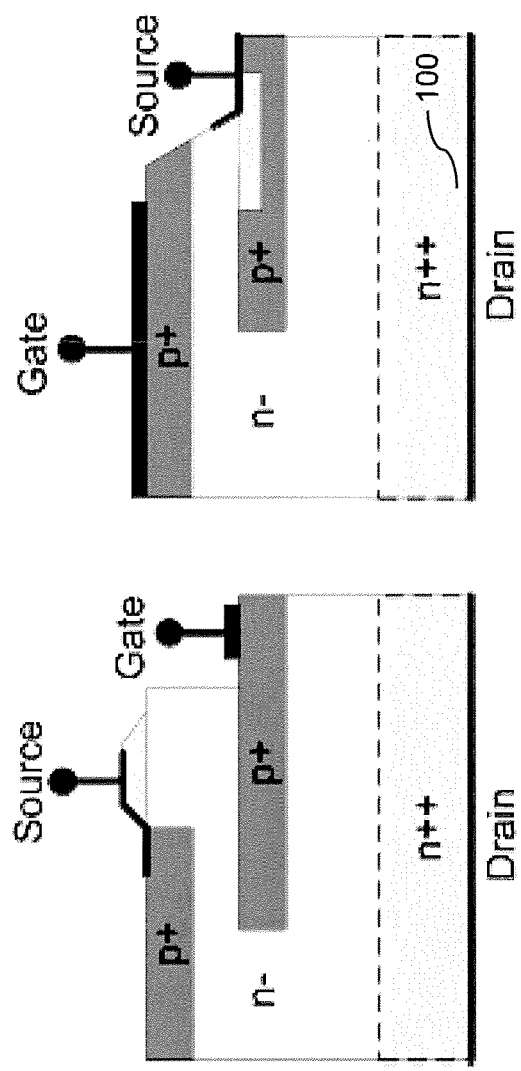

The VJFET structures of FIGS. 1A and 1B may be improved upon both in the on-resistance per unit area at a given voltage rating, as well as in reducing $C_{GD}$ and enhancing switching speed. Structures may also be implemented to incorporate a built in PiN diode or JBS Schottky diode to accommodate circuits requiring bi-directional current flow. The disclosure is directed to these and other important needs.

The present disclosure provides improved design structures of a high-voltage VJFET in order to overcome the aforementioned design disadvantage. For example, an aspect of the present disclosure is to provide a VJFET with low on-resistance and low gate-drain capacitance $C_{GD}$. This can be accomplished with a trench shield approach that utilizes a double trench structure—a shallow trench to provide shorter vertical channel and gate channel control, and a deeper trench to provide better channel shielding from the high voltage at the drain. It is also an object of the present disclosure to provide manufacturing methods for the aforementioned structures.

Figure 2A:
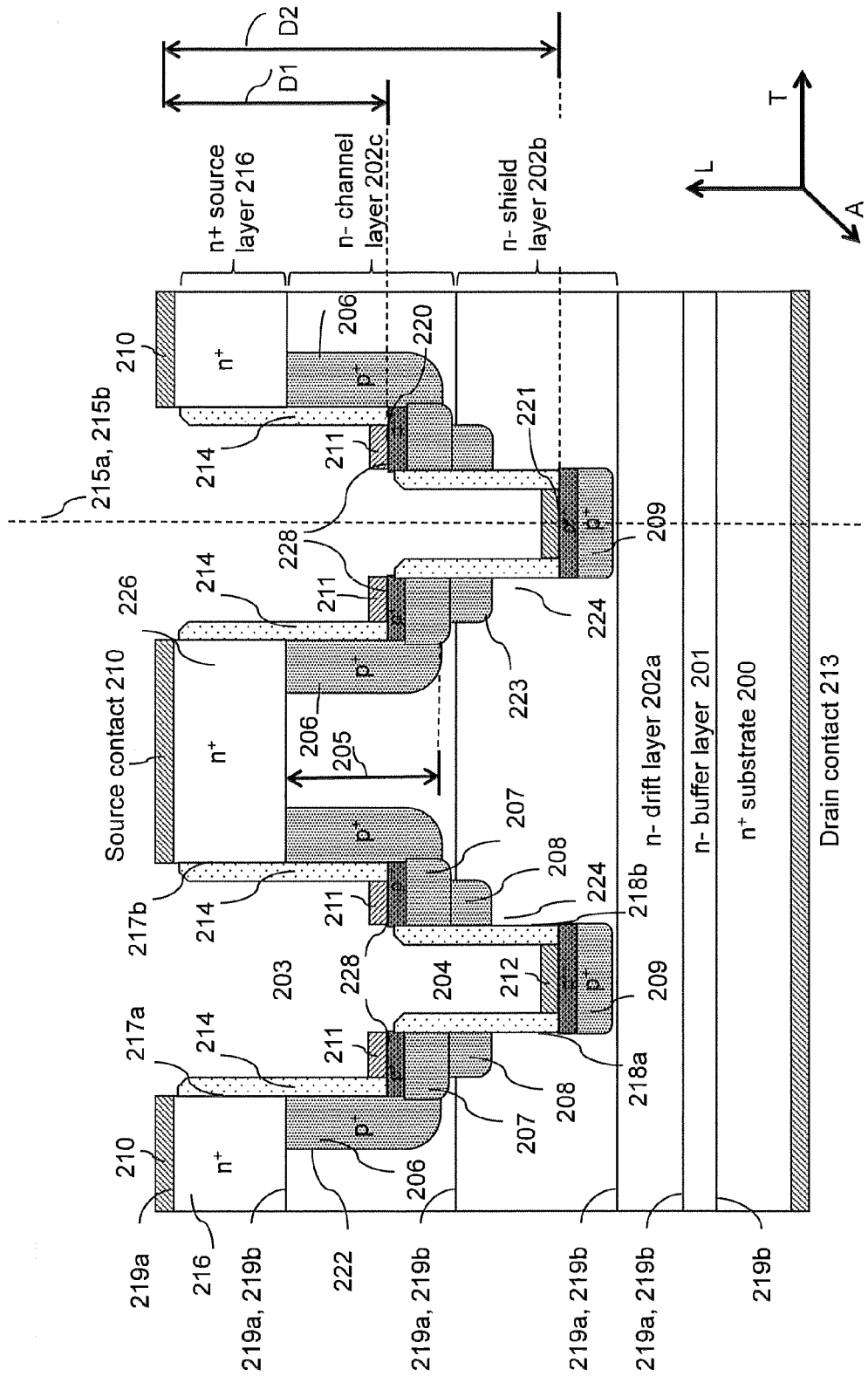
FIGS. 2A-2B illustrate exemplary embodiments of the trench shield VJFET, where the center of the shield trench is aligned with the center of the gate trench, and the shield trench is connected to the source or the gate potential.
Figure 2B:
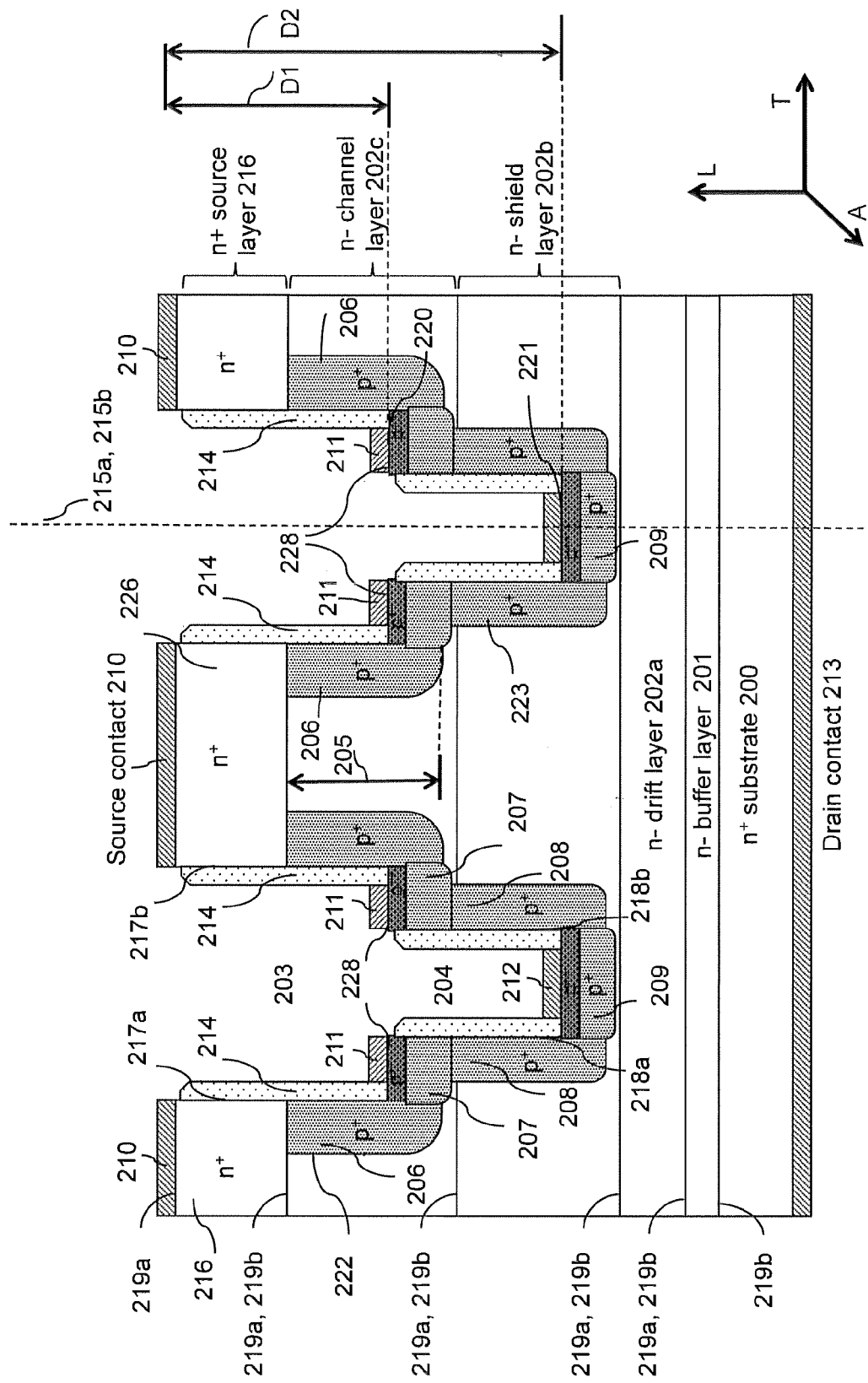

The first two illustrative embodiments of FIGS. 2A and 2B utilize a double trench approach, where a deeper trench is located in, or "nested," within a wider, shallower trench. The deeper trench—which may be referred to as the shield trench 204—functions as the shield, and the shallower trench—which may be referred to as a gate trench 203—functions as the gate. The third and fourth illustrative embodiments of FIGS. 2C and 2D use two separate trenches adjacent to each other, of two different depths, the deeper trench functioning as the shield and the shallower trench as the gate. Exemplary fabrication methods for these device structures are shown and described in the remaining figures.

FIG. 2A depicts an illustrative cross-sectional view of a shielded trench VJFET structure utilizing a double trench approach in which a second trench is "nested" within a first trench that is wider and shallower than the second trench. Thus, the second trench can be understood as overlapping the first trench. As shown in FIG. 2A, a shielded trench VJFET is built on a wafer containing a substrate 200, one or more buffer layers 201, one or more drift layers 202a, a shield layer area 202b comprising one or more shield layers, a channel layer area 202c comprising one or more channel layers, one or more source layers 216, and a source contact layer 210. Each of the substrate 200, the buffer layer(s) 201, the drift layer(s) 202a, the shield layer(s) in shield layer area 202b, the channel layer(s) in channel area 202c, the source layer(s) 216, are of a first conductivity type. Each of the substrate 200, the buffer layer(s) 201, the drift layer(s) 202a, the shield layer(s) in shield layer area 202b, the shield layer area 202b, the channel layer(s) in channel area 202c, the channel layer area 202b, and the source layer(s) 216 should be understood to be planar layers containing a first planar surface 219a and a second planar surface 219b, both of which extend in a first direction, such as a transverse direction T, and a second direction that is perpendicular to the first direction, such as a lateral direction A. Each first surface 219a may be understood as being an upper surface located above the second, lower surface 219b when moving along the longitudinal direction L—which is perpendicular to both the transverse direction T and the lateral direction A—from the substrate 200 toward the source layer 216. Each of the substrate 200, the buffer layer(s) 201, the drift layer(s) 202a, the shield layer(s) in shield layer area 202b, the channel layer(s) in channel area 202c, and the source layer(s) 216 also have a thickness which extends in a third direction, such as a longitudinal direction L, between the first surface 219a and the second surface 219b. As shown in FIG. 2A, the buffer layer(s) 201 may be located on top of the substrate 200, the drift layer(s) 202a may be located on top of the buffer layer(s) 201, the shield layer(s) in shield layer area 202b may be located on top of the drift layer(s) 202a, channel layer(s) in channel area 202c may be located on top of the shield layer(s) in shield layer area 202b, the source layer(s) 216 may be located on top of the channel layer(s) in channel area 202c, and the source contact layer 210 may be located on top of the source layer(s) 216 along the longitudinal direction L.

As further illustrated in FIG. 2A, the shielded trench VJFET also includes at least one gate trench 203 and at least one shield trench 204. Each gate trench 203 and shield trench 204 have two side walls 217a and 217b, 218a and 218b, respectively, extending substantially in one direction, such as the longitudinal direction L, and a width extending in different direction, such as the transverse direction T, between the two side walls. As depicted in FIG. 2A, the gate trench 203 has a width that is greater than the width of the shield trench 204.

Each gate trench 203 and shield trench 204 also have a depth extending in another direction, such as the longitudinal direction L, that is perpendicular to the width. The depth of gate trench 203 D1 may be defined as the distance between the upper surface 219a of the source layer 216 and a bottom surface 220 of the gate trench 203. The depth of the shield trench 204 D2 may be defined as the distance between the upper surface 219a of the source layer 216 and a bottom surface 221 of the shield trench 204. The bottom surfaces 220, 221 of each of the gate trench 203 and the shield trench 204 extends in the transverse direction T. The bottom surfaces 220, 221 of the gate trench 203 and the source trench 204 are located between the upper surface 219a and the lower surface 219b of the channel layer area 202c and the shield layer area 202b, respectively. As depicted in FIG. 2A, each gate trench 203 has the same depth D1 and each shield trench 204 has the same depth D2. Further, the depth D2 of each shield trench 204 is greater than the depth D1 of gate trench 203 along the longitudinal direction L. It should be understood that each of gate trench 203 may extend at least partially through the channel layer area 202c, and each of shield trench 204 may extend at least partially through the shield layer area 202b along the longitudinal direction L.

The width of each gate trench 203 may be understood as being centered about a centerline 215a, where centerline 215a extends in the longitudinal direction L. Similarly, the width of each shield trench 204 may be understood as being centered about a centerline 215b, where centerline 215b extends in the longitudinal direction L. Using centerlines 215a and 215b as a reference, shield trench 204 may be understood as being located within (e.g., nested in) the gate trench 203 in a variety of ways. For example, centerlines 215a and 215b may be aligned with one another along the transverse direction T, as shown in FIGS. 2A and 2B, such that the shield trench 204 is centered in the gate trench 203. Alternatively, centerlines 215a and 215b may be offset (e.g., not aligned) a distance along the transverse direction T such that shield trench 204 is located, but not centered, in gate trench 203. For example, the centerlines 215a and 215b may be offset along the transverse direction T such that (1) side wall 217a of the gate trench 203 is aligned with one of the side walls 218a and 218b of the shield trench 204 or (2) side wall 217b of the gate trench 203 is aligned with one of the side walls 218a and 218b of the shield trench 204.

As depicted in FIG. 2A, side walls 217a, 217b of the gate trench 203 extend from the bottom surface 220 of the gate trench 203 to the upper surface 219a of the source layer 216. Further, side walls 218a, 218b of the shield trench 204 extend (1) from the bottom surface 221 toward upper surface 219a of the source layer 216 and (2) at least part of the distance between the bottom surface 221 and upper surface 219a of the source layer 216 (e.g., depth D2). For example, one or both of side walls 218a, 218b may extend between the first bottom surface 220 of the gate trench 203 and the second bottom surface 221 of the shield trench 204. Alternatively, one or both of side walls 218a, 218b may extend between the second bottom surface 221 of the shield trench 204 and upper surface 219a of the source layer 216. The example shown in FIG. 2A, as an example, shows both of side walls 218a, 218b extending between the first bottom surface 220 of the gate trench 203 and the second bottom surface 221 of the shield trench 204.

Implanted regions of a second conductivity type may be located in sidewalls and bottom each of the gate trench 203 and the shield trench 204. The bottom 220 of the gate trench 203 may contain an implanted region 207 connected to implanted regions 206 in each of sidewall 217a, 217b of the gate trench 203 to collectively form a U-shaped conductivity region 222 of the second conductivity type in the gate trench 203. Further, implanted regions 206 may extend along sidewalls 217a, 217b through the channel layer(s) in channel area 202c only—the N+ layer 216 having a doping concentration of the first conductivity type sufficiently large to prevent the creation regions of the second conductivity type by implantation. For figure clarity, the first conductivity type is shown as n type, and the second conductivity type is shown as p type, however the opposite configuration with the first conductivity type being p type, and the second conductivity type being n type is also possible. The bottom 220 of the gate trench and the bottom 221 of the shield trench may be implanted to higher doping concentration at the surface to alleviate formation of ohmic contacts.

Continuing with FIG. 2A, sidewalls 218a, 218b and the bottom of the shield trench 204 may contain implanted regions of the second conductivity. For example, the bottom 221 of the shield trench 204 may contain an implanted region 209 and each sidewall 218a, 218b may contain implanted regions 208 to collectively form a U-shaped conductivity region 223 of the second conductivity type in the shield trench 204. Implanted regions 208 may extend partially along sidewalls 218a, 218b in the epi layers 202. For example, as depicted in FIG. 2A, the implanted regions 208 extend from the bottom surface 220 of the gate trench 203 toward the bottom 221 of the shield trench 204 along only part of sidewalls 218a, 218b. An unimplanted region 224 of the first conductivity type extends along the remainder of sidewalls 217a, 217b, the unimplanted region 224 being disposed between the bottom surface 221 of the shield trench 204 and implanted regions 208 along the longitudinal direction L.

Staying with FIG. 2A, metal regions at the top of the VJFET structure provide a source contact 210 and metal regions located adjacent to the bottom of each of the respective shield trenches provide a shield contact 212. The shield contact 212 at the bottom of the shield trench 204 are, in this example, connected to the source contact 210 at a shield pickup location disposed elsewhere in the device so as to hold the shield contact 212 at source potential. For example, the shield pickup location may be disposed proximate to at an edge of the device—as is discussed elsewhere in this disclosure. By connecting one or more of the shield region 208 to the source, the gate-drain capacitance may be reduced, compared to a conventional VJFET structure. Metal regions located adjacent to the bottom of each of the respective gate trenches 203 provide at least one gate contact 211 per gate trench 203. Metal regions at the wafer back side provide a drain contact 213. Dielectric spacers 214 on the sidewalls 217, 218 of the trenches 203 and 204 provide gate-to-source and gate-to-shield isolation.

According to various embodiments disclosed herein, individual vertical channel regions 205 may be defined as a region of the channel layer area located in-between a first gate trench 203 and a second trench—which may be a gate trench 203 or a shield trench 204—adjacent to the first gate trench 203 and implanted regions 206, 207, and 208 in the side walls 217a, 217b, 218a, 218b of the adjacent trench along the transverse direction T. The second, adjacent trench may be located on either side of the first trench along the transverse direction T. For example, in the embodiment depicted in FIG. 2A, an example of a vertical channel region 205 may be defined as the region of channel layer area 202c between the implanted region 206 in the sidewall 217b of a first gate trench 203 and the implanted region 206 in the sidewall 217a of a second, adjacent gate trench 203 along the transverse direction T.

In various embodiments, two trenches disposed a distance apart from one another along, for example, the transverse direction T, may form a mesa comprised of one or both of the channel layer area 202c and the shield layer area 202b and defined by the distance. For example, in FIG. 2A, a first nested gate trench 203 and shield trench 204 pair are spaced a distance apart from a second nested gate trench 203 and shield trench 204 pair along the transverse direction T. The portion of one or more of shield layer(s) in shield layer area 202b, channel layer(s) in channel area 202c, and source layer(s) 216, located between the first and second pairs along the transverse direction T may be understood as forming a mesa 226. In an embodiment, where one or both of the first and the second nested pairs contain a gate trench 203 fully aligned with a shield trench 204, mesa 226 may contain one or two steps 228. A step 228 refers to a portion of the bottom surface 220 of the gate trench 203 located adjacent to the shield trench 204 along the transverse direction.

In the embodiment, such as the one depicted in FIG. 2A, where the sidewalls are partially implanted, the implanted region 209 in the bottom of the shield trench 204 may be utilized in order to provides an electrostatic shield to reduce the electric field at the vertical channel region 205. This allows for the use of a shorter vertical channel region 205 in order to reduce the device on-resistance. Further, the spacing between the p-regions 208 and 209 may be designed to ensure that the punch-through voltage between the gate and source/shield has a greater magnitude than the vertical channel region 205 pinch-off voltage. This may be done by ensuring a sufficient gap between p-regions 208 and 209.

FIG. 2B illustrates a cross-sectional view of another example of a trench shield VJFET with aligned gate and shield trenches and shield connected to the gate. In the device of FIG. 2B, shield contacts 212 located adjacent to the bottom of each respective shield trench 204 are, in this example, connected to the gate contact 211 at a shield pickup location disposed elsewhere in the device so as to hold the shield contact 212 at gate potential. For example, the shield pickup location may be disposed proximate to at an edge of the device—as is discussed elsewhere in this disclosure. Alternatively, implanted regions 208 may extend the entire length of sidewalls 218a, 218b located in the shield epi layer (2) in shield layer area 202b. The connection to the shield contacts 212 may also be provided through the implanted regions 208 when they extend the entire length of sidewalls 218a and 218b. This embodiment may provide identical improvement in on-resistance as the embodiment of FIG. 2A. But, by connecting the shield region to the gate, the gate-drain capacitance may no longer be reduced, compared to a conventional VJFET structure. However, the fabrication complexity of the embodiment of FIG. 2A may be alleviated by the embodiment of FIG. 2B—which eliminates concerns associated with the device of FIG. 2A for gate-source shorting through the shield trench 204 implanted sidewall regions 208 and the metal regions 211 and 212.

Figure 2C:
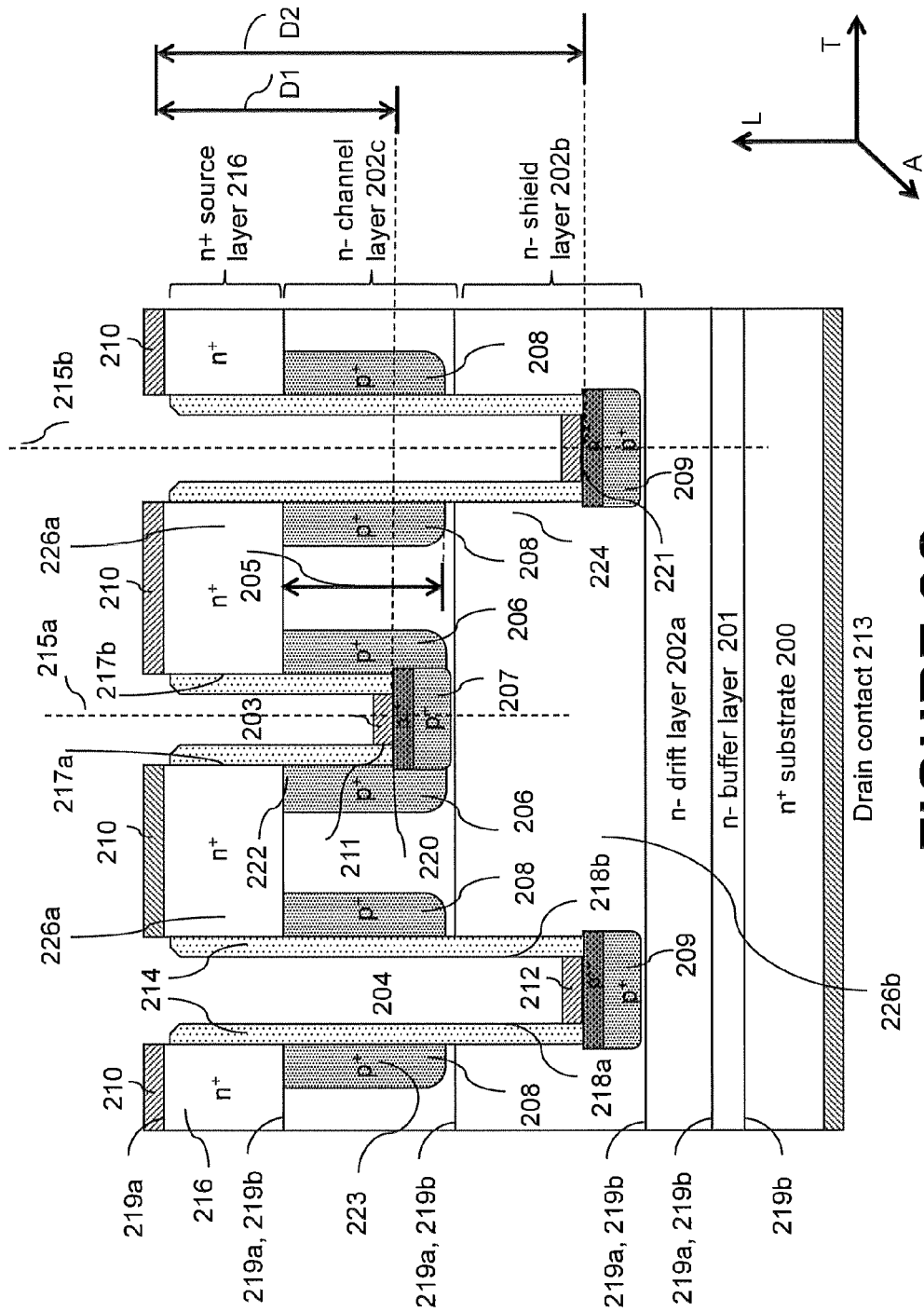
FIGS. 2C-2D illustrate exemplary embodiments of the trench shield VJFET, where the center of the shield trench is not aligned with the center of the gate trench, and the shield trench sidewall is partially or completely implanted with the same dopant as the shield.

FIG. 2C illustrates an exemplary cross-sectional view of another embodiment of a trench shield VJFET in which respective gate trenches 203 and shield trenches 204 are separated such that they do not overlap. The gate trenches 203 and shield trenches 204 of FIG. 2C can therefore be understood as being offset. In particular, FIG. 2C illustrates an example in which centerlines 215a of gate trenches 203 and centerline 215b of shield trench 204 are offset (e.g., not aligned) a distance along the transverse direction T such that shield trench 204 is completely separate from gate trench 203. In other words, the gate trench 203 and the shield trench 204 are offset a distance sufficient to prevent any overlap between the gate trench 203 and the shield trench 204. Further, although FIG. 2C depicts shield trenches 204 and gate trenches 203 positioned in an alternating pattern along the transverse direction T, it should be understood that gate trenches 203 and shield trenches 204 can be arranged in any order. There may also be an unequal number of gate trenches 203 and shield trenches 204. As described above, in respective gate trenches 203, regions 206 are connected to the gate potential, while individual regions 208 may be connected to either the gate or the source potential. The bottom 220 of the gate trench 203 is implanted to form a region 207 with a conductivity of a second type that is connected to the sidewall implanted regions 206. The sidewalls 218a, 218b of the shield trench 204 may be partially implanted to form regions 208 with a conductivity of second type, and the bottom 221 of the shield trench 204 is implanted to form a region 209 with a conductivity of second type that provides an electrostatic shield to reduce the electric field at the vertical channel regions 205 so that a shorter vertical channel regions 205, along the longitudinal direction L, can be used in order to reduce the device on-resistance. In an example embodiment, the contact 212 at the bottom of the shield trench is connected to the source potential at a shield pickup location. In this embodiment, if the sidewall p-regions 208 are connected to gate potential, sufficient spacing may be designed between regions 208 and 209 to ensure that the punch through voltage between them exceeds the channel 205 pinch-off voltage by a sufficient margin. If instead, the region 208 is connected to source potential, then the vertical channel region 205 doping may be designed to ensure that the punch-through voltage between regions 208 and 206 exceeds the vertical channel region 205 pinch-off voltage by a sufficient margin. It should be understood that a configuration of the same structure is possible, where the shield is connected to the gate potential.

In the example depicted in FIG. 2C, vertical channels 205 may be defined as the region of channel layer area 202c between the implanted regions 206 in the sidewalls 217a, 217b of a first gate trench 203 and the implanted regions 208 in the sidewalls 218b, 218a, respectively, of adjacent shield trenches 204.

The embodiment depicted in FIG. 2C contains two types of mesas: channel mesas 226a and combined channel-shield mesas 226b. For example, one or more channel mesas 226a may be defined by an adjacent gate trench 203—shield trench 204 pair, the pair being spaced a distance apart along the transverse direction T. The portion of one or more channel layer(s) in channel area 202c and source layer(s) 216, located between gate trench 203—shield trench 204 pair may be understood as forming individual mesas 226a. Further, one or more combined channel-shield mesas 226b may be defined a pair of adjacent shield trenches 204 spaced a distance apart along the transverse direction T. The portion of one or more shield layer (a) in shield layer area 202b, channel layer(s) in channel area 202c and source layer(s) 216, located between the pair of shield trenches 204 may be understood as forming individual mesas 226b. Individual mesas 226b may also be understood as including two channel mesas 226a and a gate trench 203.

Figure 2D:
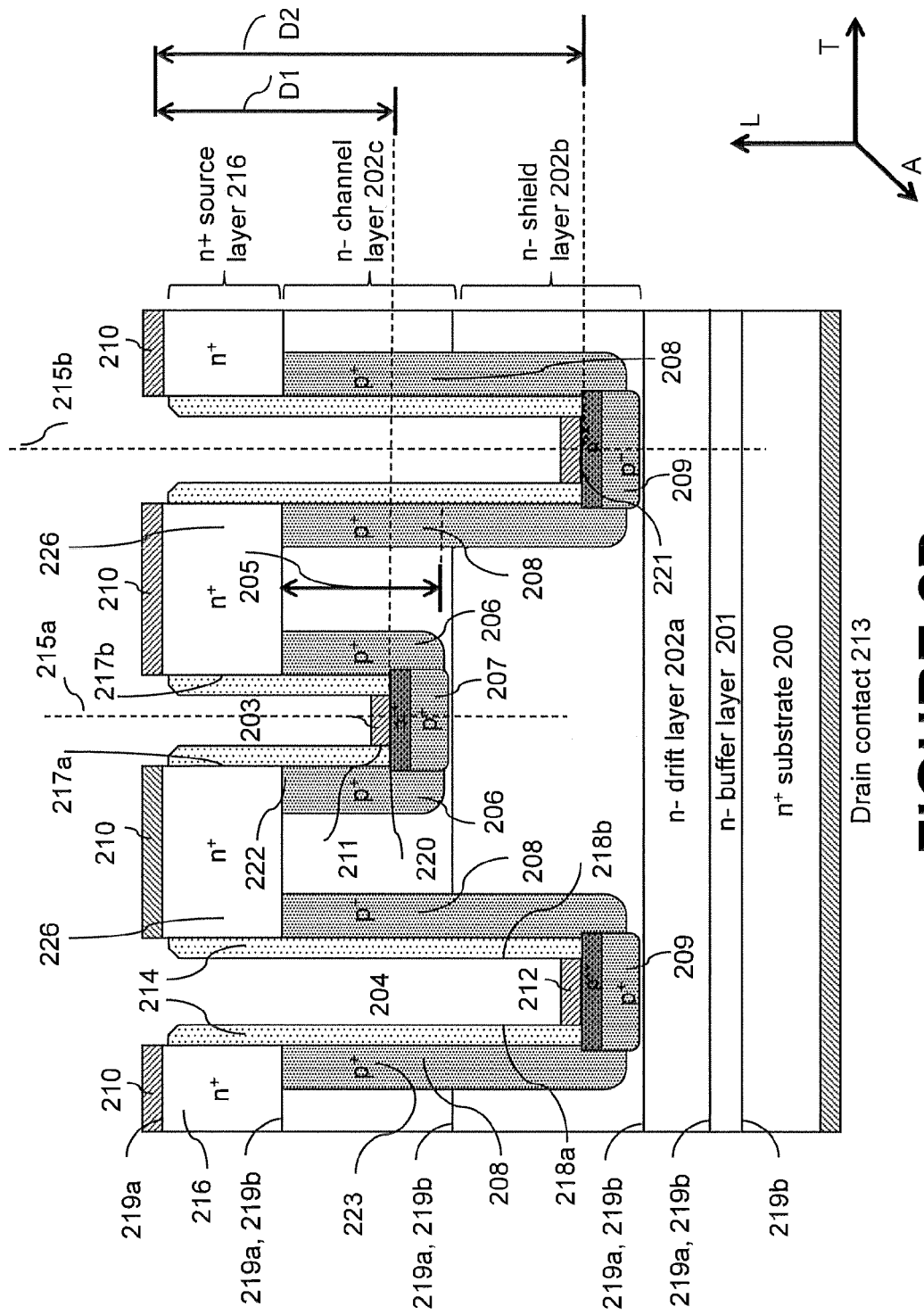

FIG. 2D illustrates an exemplary cross-sectional view of a trench shield VJFET with separated gate trenches 203 and shield trenches 204 as well as a shield connected to the source potential. Region 206 in FIG. 2D is connected to the gate potential, while region 208 is connected to the shield (source) potential. Further, region 209 in the bottom 221 of the shield trench 204 is connected to the sidewall implanted regions 208—which extend the entire length of sidewalls 218a, 218b located in the channel epi layer area 202c and shield epi layer area 202b. The sidewalls of the shield trench are fully implanted to form regions 208 with a conductivity of second type, and the bottom of the shield trench is implanted to form a region 209 with a conductivity of second type that provides an electrostatic shield to reduce the electric field at the channel so that a shorter vertical channel region 205 can be used in order to reduce the device on-resistance. The metal contact disposed adjacent to the bottom of the shield trench is connected to the source potential at a shield pickup location elsewhere on the device. Further, channel 205 doping may be designed to ensure than the punch-through voltage between regions 208 and 206 exceeds the vertical channel region 205 pinch-off voltage by a sufficient margin. In this embodiment, it may be also possible to achieve local shorting between the shield and source by etching down the sidewall spacers 214 selectively in the shield trench 204, exposing part of the sidewall implanted region 208 to be shorted to the source 210 when the source electrode is formed. It should be understood that a configuration of the same structure is possible, where the shield is connected to the gate potential.

It should be understood that a device may comprise a combination of those trenches depicted in each of FIGS. 2A, 2B. 2C, and 2D.

FIGS. 3A-3K illustrate an exemplary process for the fabrication of the shielded vertical JFETs such as those devices shown and described in connection with FIGS. 2A and 2B.

FIG. 3A illustrates an exemplary starting wafer. The process begins as illustrated in FIG. 3A with the growth of one or more the epitaxial (epi) buffer layers 201, followed by one or more drift epi layers 202a, one or more shield layers in shield layer area 202b, one or more channel layers, and then one or more source layers 216, on the substrate 200. It should be understood that the substrate 200 may also be referred to as the substrate layer. It should be understood that the epitaxial buffer layer 201 may also be referred to as the buffer layer. Alternatively, the shield layer(s) in shield layer area 202b and the channel layer area 202c may be formed by implantation into the drift layer 202a, in which case the doping where these layers will be formed is kept light during epitaxial growth, allowing the actual doping to be precisely set by implantation after growth.

Figure 3B:
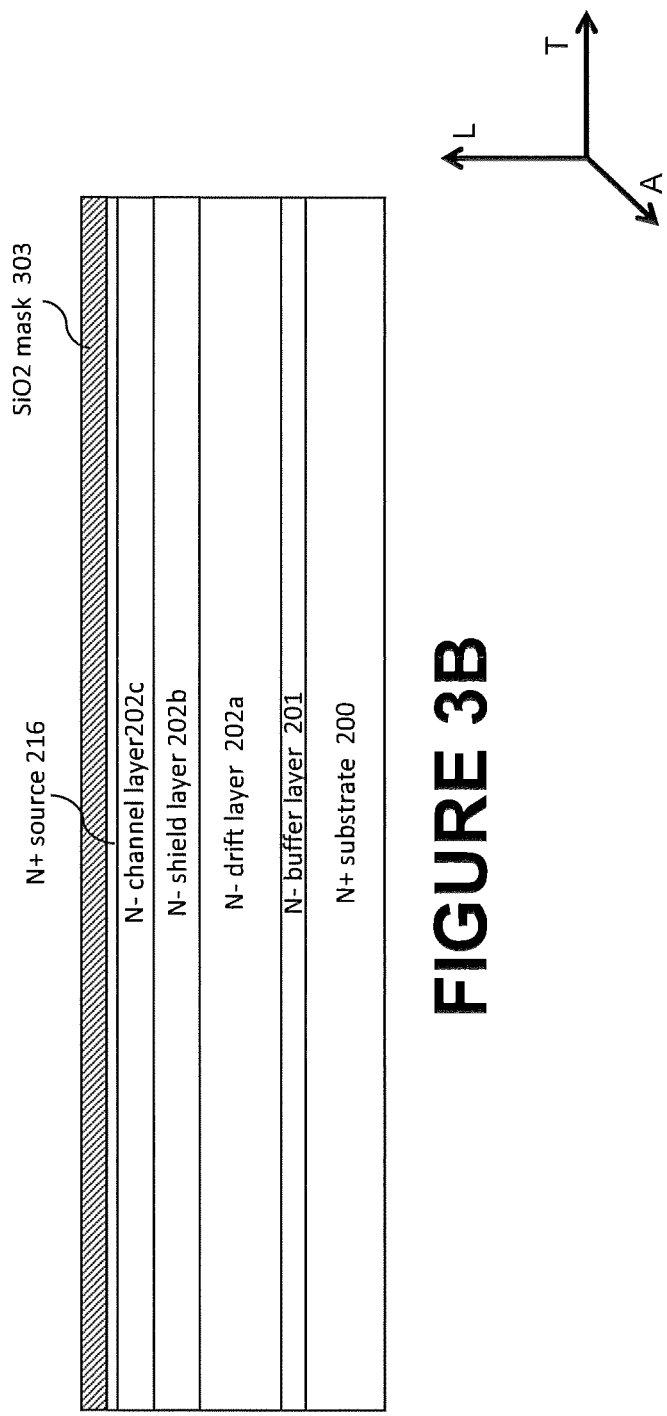
Figure 3C:
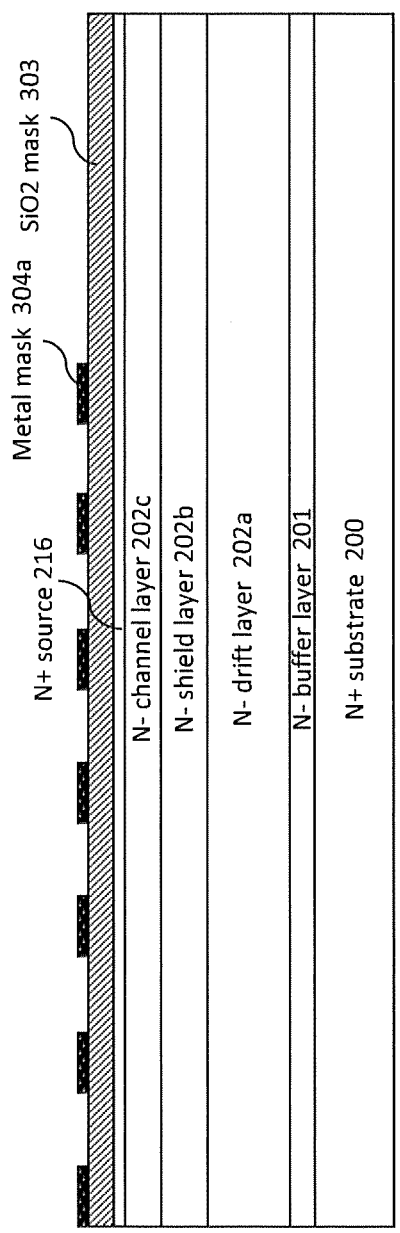
Figure 3D:
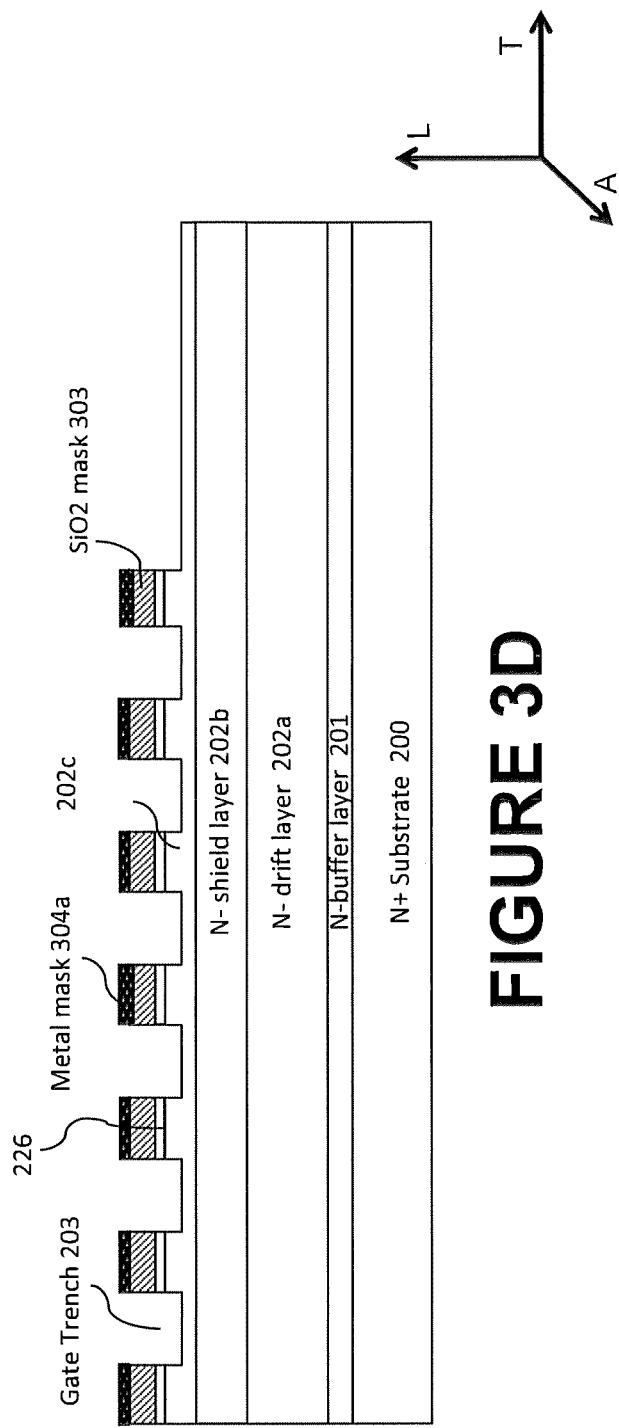

FIGS. 3B-3D illustrate an exemplary process for the formation of a composite oxide or $SiO_2$ mask 303 and metal mask 304a (hardmask) by deposition and lithography, followed by the oxide and shallow trench etch. FIG. 3B illustrates the formation of the implant $SiO_2$ mask 303. FIG. 3C illustrates the formation of the first etch metal mask 304a. FIG. 3D illustrates the first trench etch which results in gate trench 203.

Figure 3E:
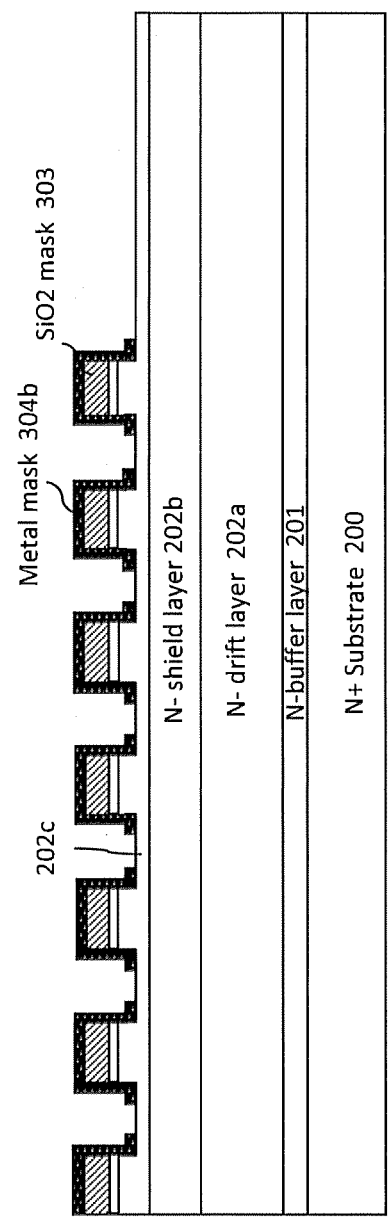
Figure 3E:
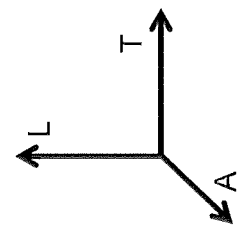

FIG. 3E illustrates an exemplary process for the utilizing a second etch mask layer 304b. FIG. 3E shows the deposition and patterning of the second etch mask layer 304b with an opening within the shallower trench bottom plane. It should be understood that second etch mask layer 304b may also be referred to as second metal mask layer. As compared to the first etch mask 304a, the opening of the second etch mask layer 304b is smaller. Second etch mask layer 304b may be formed by, for example, by removing first etch mask 304a prior to forming second etch mask 304b or by depositing additional material to the first etch mask 304a to form second etch mask 304b.

Figure 3F:
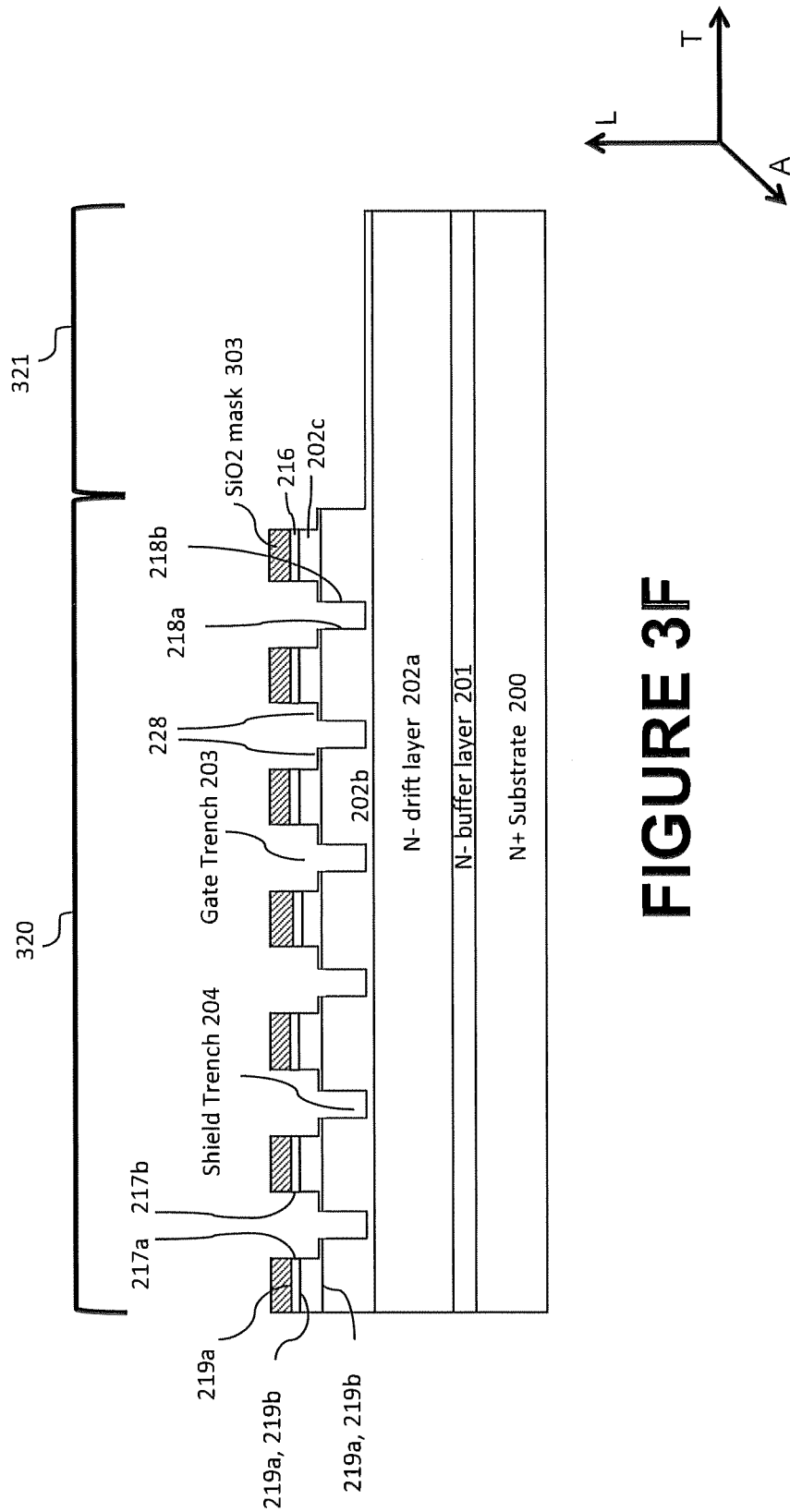

FIG. 3F illustrates an exemplary process for doing a second trench etch. FIG. 3F shows the appearance of the wafer after the formation of the deeper shield trench 204 by etching—using the second metal mask 304b with its narrow openings as the hardmask. FIG. 3F is shown with the metal removed by, for example, selective wet etching.

As illustrated in FIG. 3F, an array of mesas 226 with at least one step 228 may be formed for the active area 320, while termination area 321 and shield pickup area 501 (FIG. 5A) is etched down to the level of the shield trench 204 where the termination and shield pickup regions will be formed. In a gate pickup area 502 (FIG. 5A) the deeper shield trench 204 etch is not done where the gate pickup regions will be by ensuring that the gate pickup area 502 remains covered by the second metal mask 304b during the trench etch. It should be understood that the termination area 321 may be referred to as guard ring termination area.

Figure 3G:
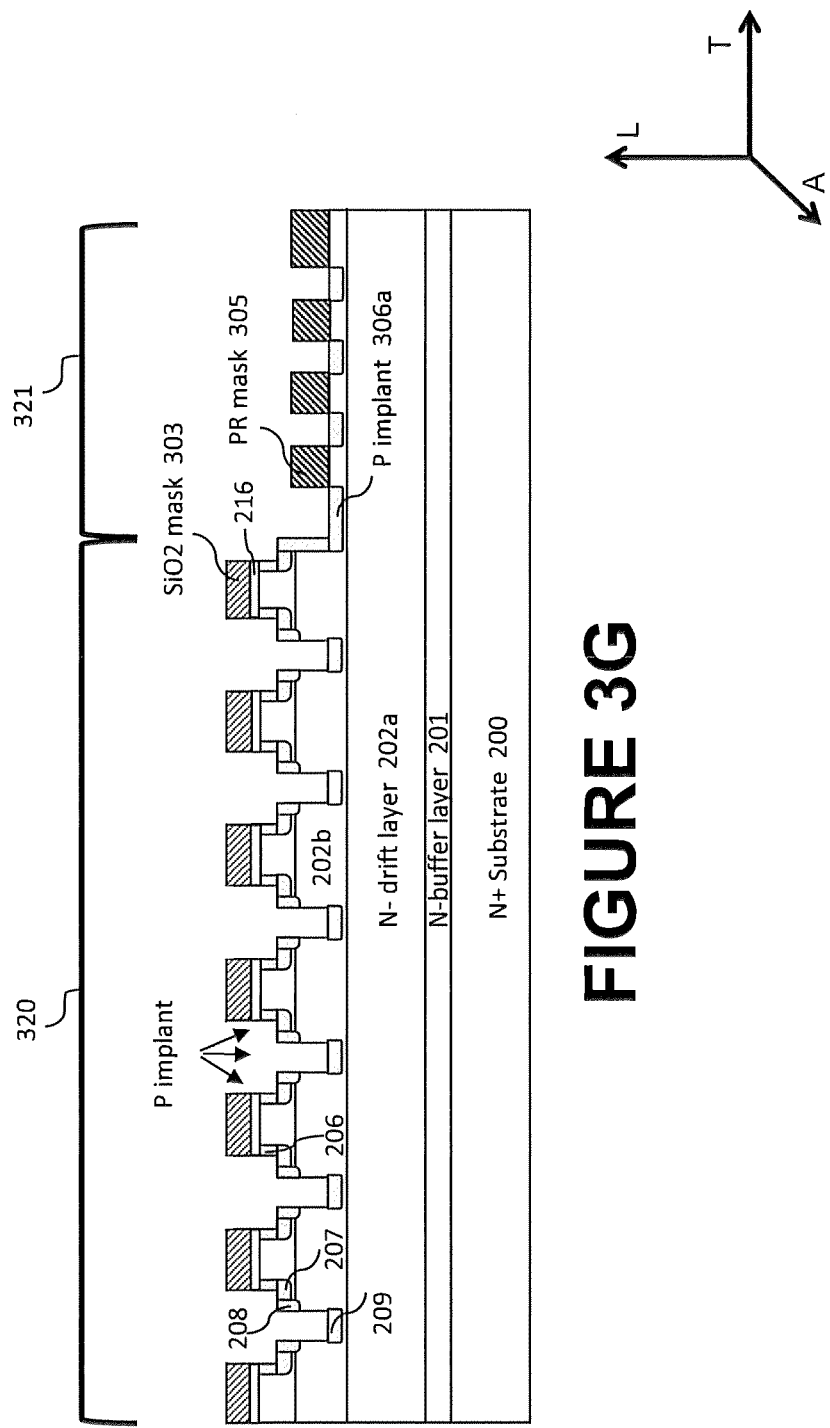

FIG. 3G illustrates an exemplary process for the formation of a gate implant. FIG. 3G shows the application of a guard ring mask, where the photoresist mask 305 defines guard ring spaces, while being fully cleared in the active area 320. It may be understood that photoresist mask 305 may also be referred to as PR mask. Vertical and tilted p-implants are then performed at room temperature to form the implanted regions around the gate trench 203, and the shield trench 204 such as implanted regions 206, 207, 208, 209 in the side walls 217a, 217b, 218a, 218b of the gate trench(es) 203 and shield trench (es) 204 and also P implant 306a regions (also known as guard ring implants). It will be appreciated that implanted regions 206, and 208 may be formed before, during, or after implanted regions 207 and 209—which accounts for the variation between depicted configuration of implanted regions 206, 207, 208, 209 in FIG. 3G vs. FIGS. 2A and 2B. The vertical and tilted p-implants may have different doses and may create different doping concentration on the bottom of the trenches 203 and 204, in regions 207 and 209, and on the trenches side walls 217a, 217b, 218a, 218b, in regions 206 and 208. The implanted concentration regions 207 and 209, close to the surface of the trenches 203 and 204, may be higher in order to alleviate formation of ohmic contacts. The implant angle control based on the cell geometry may assure that there are no short forms along the deep trench sidewall. Should a high temperature implant be needed, the photoresist mask 305 may need to be replaced by materials such as refractory metal, polysilicon, oxide, or nitride, or the like. In the example, once the resist is stripped, the oxide is stripped, the wafer may be cleaned and subjected to implant anneal. Techniques such as surface graphitization may be applied, and the annealing ambient and temperature chosen to achieve dopant activation. The wafers may then be cleaned to remove the graphite cap, and a thin oxide may then be grown to consume the damaged surface and improve surface behavior. It may be understood that guard ring termination type shown may be substituted with a different type of termination, such as junction termination extension (JTE). In such a case the implants needed to form the JTE may need to be done in a separate implant step during which the active area may or may not be implanted.

Figure 3H:
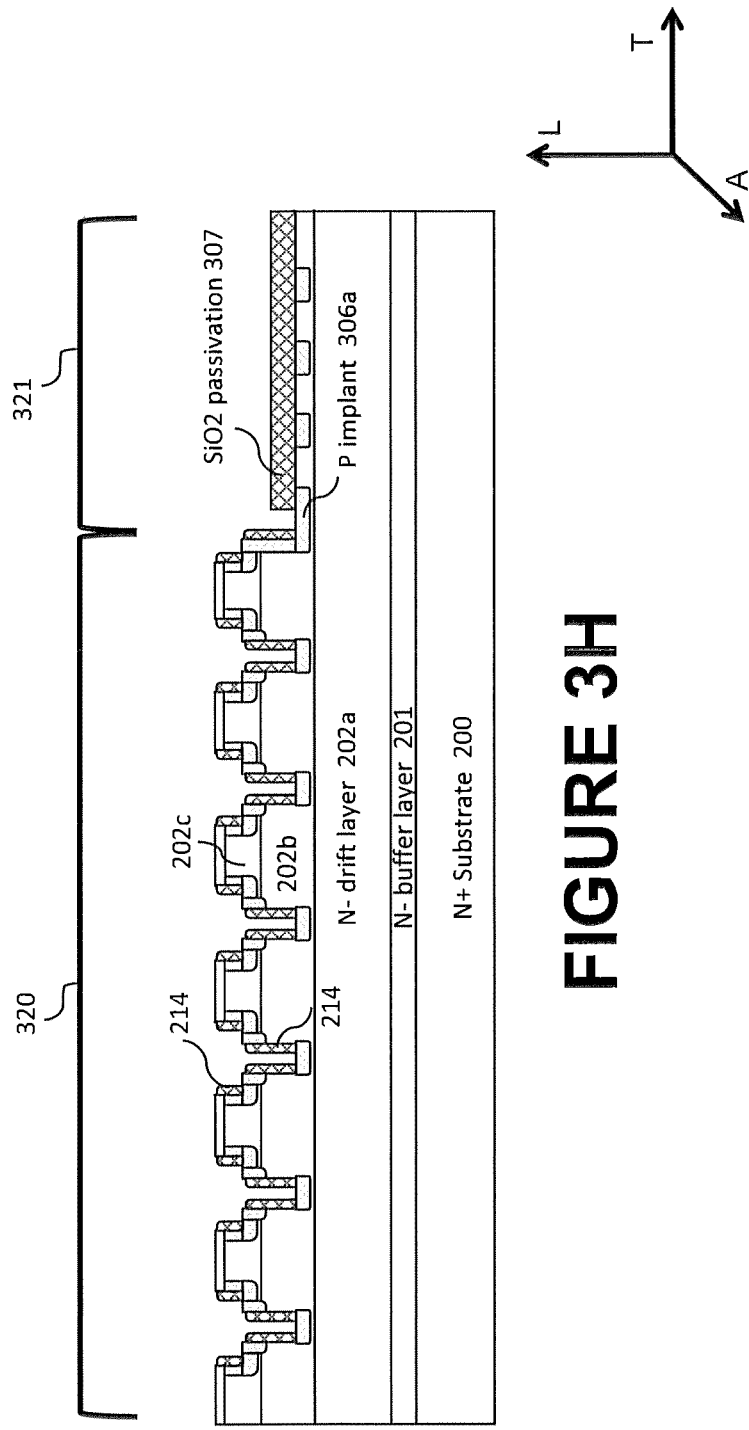

FIG. 3H illustrates an exemplary passivation and exemplary formation of ohmic contact windows. As depicted in FIG. 3H, dielectric spacers 214 are deposited, and etched back with a mask (not shown) protecting the termination regions to form spacers in the active region 320 and a $SiO_2$ passivation layer 307 in the termination area 321. The mask may be referred to as the ohmic contact window mask.

Figure 3I:
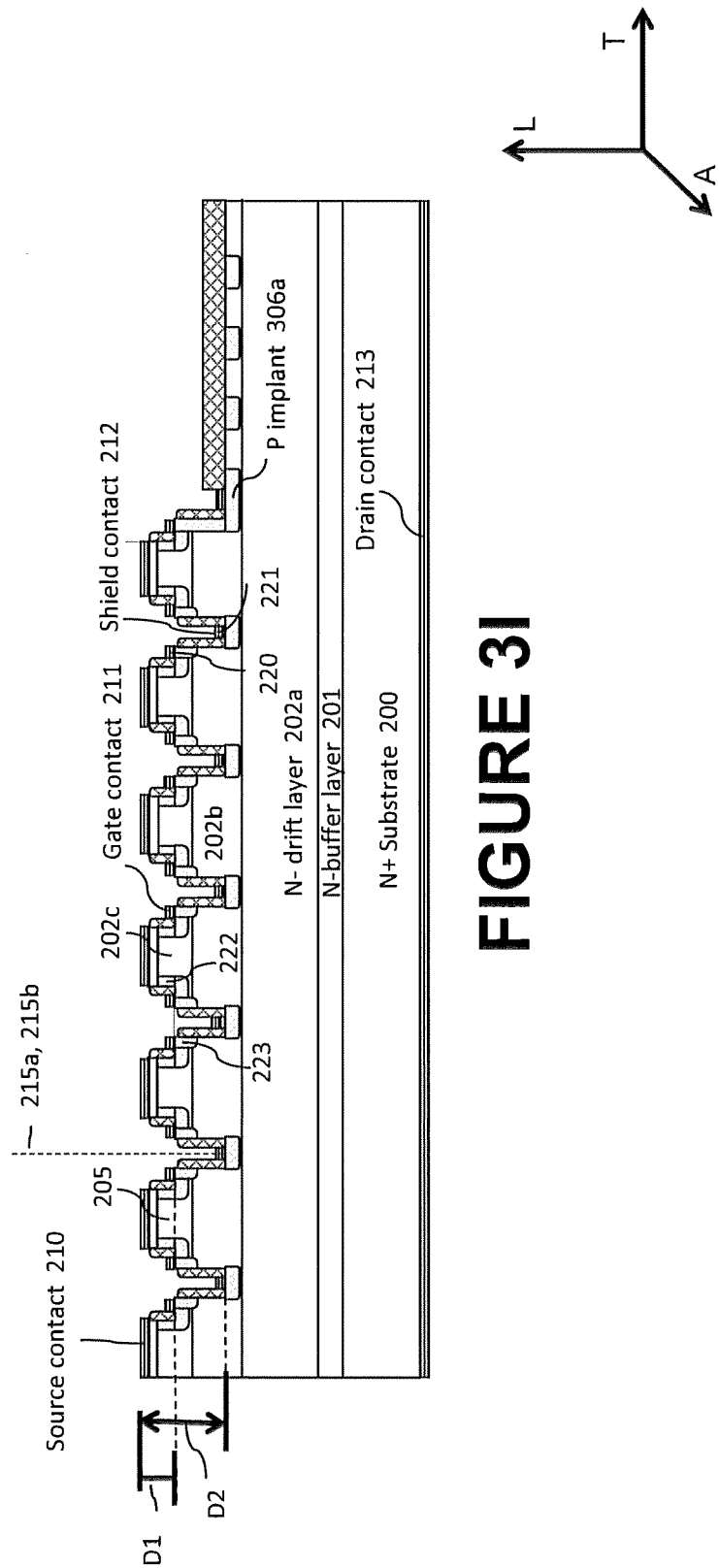

FIG. 3I illustrates an exemplary formation of ohmic contacts. FIG. 3I illustrates how a contact metal such as Nickel may be deposited, and silicided with techniques such as rapid thermal or furnace annealing, followed by wet etching of the excess unreacted Nickel to form the ohmic contacts to the gate 211, source 210, shield 212 and shield pickup contact regions 501 (FIG. 5A) In this example, in order to form the drain contact 213 with the same anneal, the backside films are first stripped with the frontside protected by a photoresist, a layer of material such as Nickel is deposited on the back, the protective resist is removed, and then both the top and bottom surfaces are subjected to a single anneal.

Figure 3J:
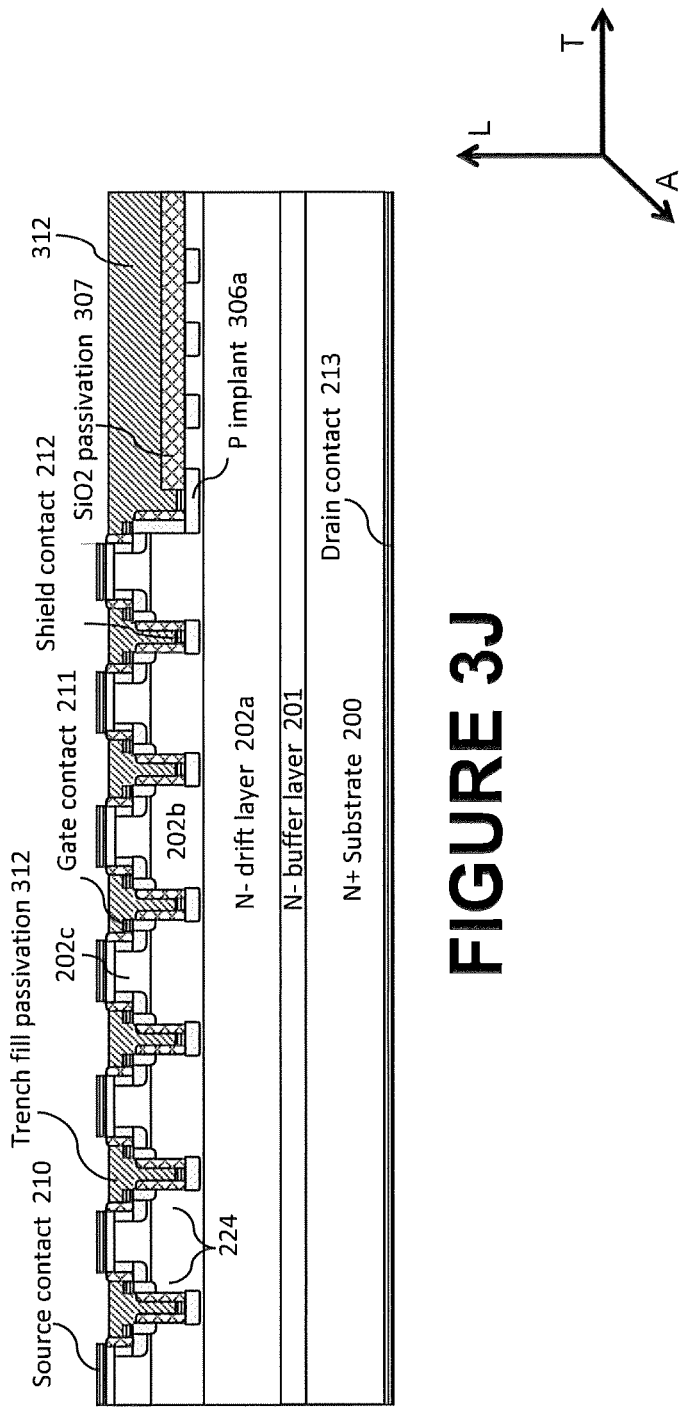

FIG. 3J illustrates an exemplary trench fill. FIG. 3J shows how the trenches are filled by a dielectric 312 (also known as trench fill passivation), such as silicon dioxide ($SiO_2$). Techniques such as BPSG fill and reflow, multiple oxide deposition and etch back sequences, or the like may be used to achieve this.

Figure 3K:
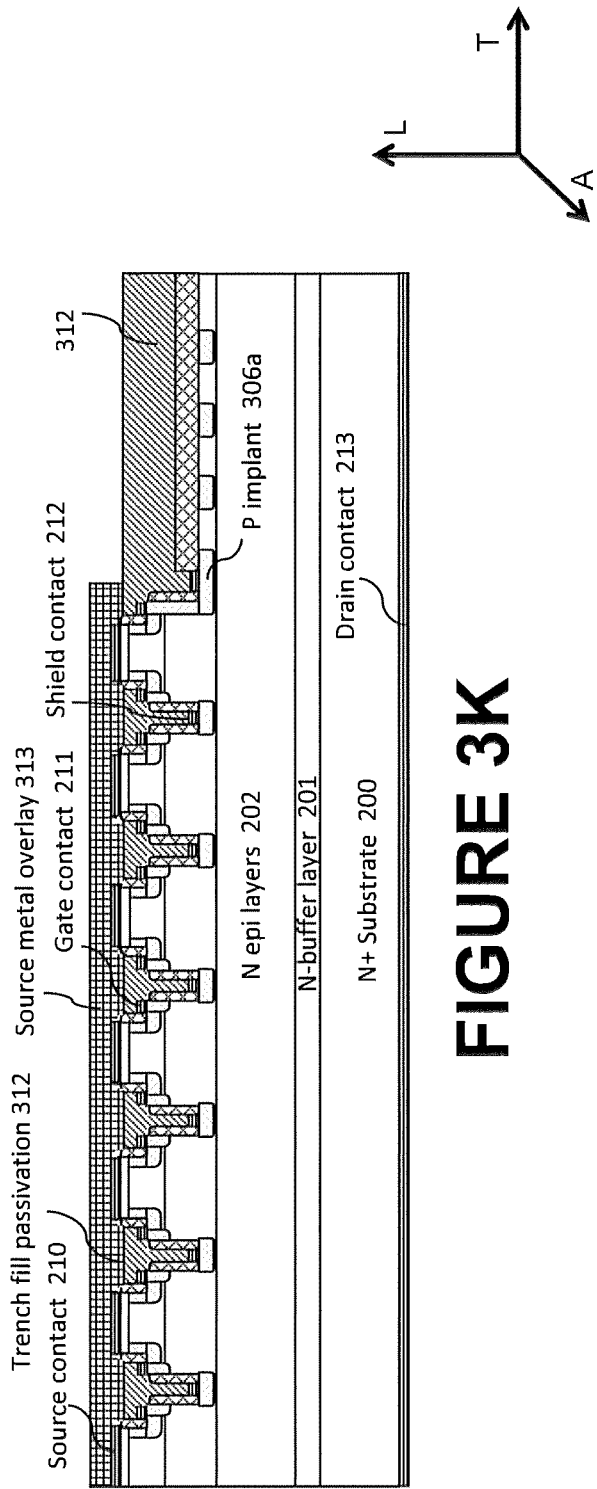

FIG. 3K illustrates an exemplary metal overlay and final passivation. FIG. 3K shows how an overlay metal 313 (also known as a source metal overlay) may be patterned on the device to form the gate and source metal pads. The device is now complete, and an optional step may be performed to further passivate the device surface with a patterned low temperature oxide, nitride, polyimide or BCB and define bond pad openings therein.

FIGS. 4A-4M illustrate exemplary processes for the fabrication of the exemplary device of illustrated in FIG. 2C, that can be easily adapted to exemplary device illustrated in FIG. 2D.

FIG. 4A illustrates a starting wafer. As illustrated in FIG. 4A, the process begins with the growth of the epitaxial buffer layer 201, followed by the drift layer 202a, and then the shield layer area 202b, the channel layer area 202c and the n+ source layers 216 on the substrate 200. If it is preferred to form some or all of the layers in areas 202b, 202c, and 216 by implantation, then the doping for these layers is kept light during epitaxial growth, allowing the actual doping to be precisely set by implantation.

Figure 4B:
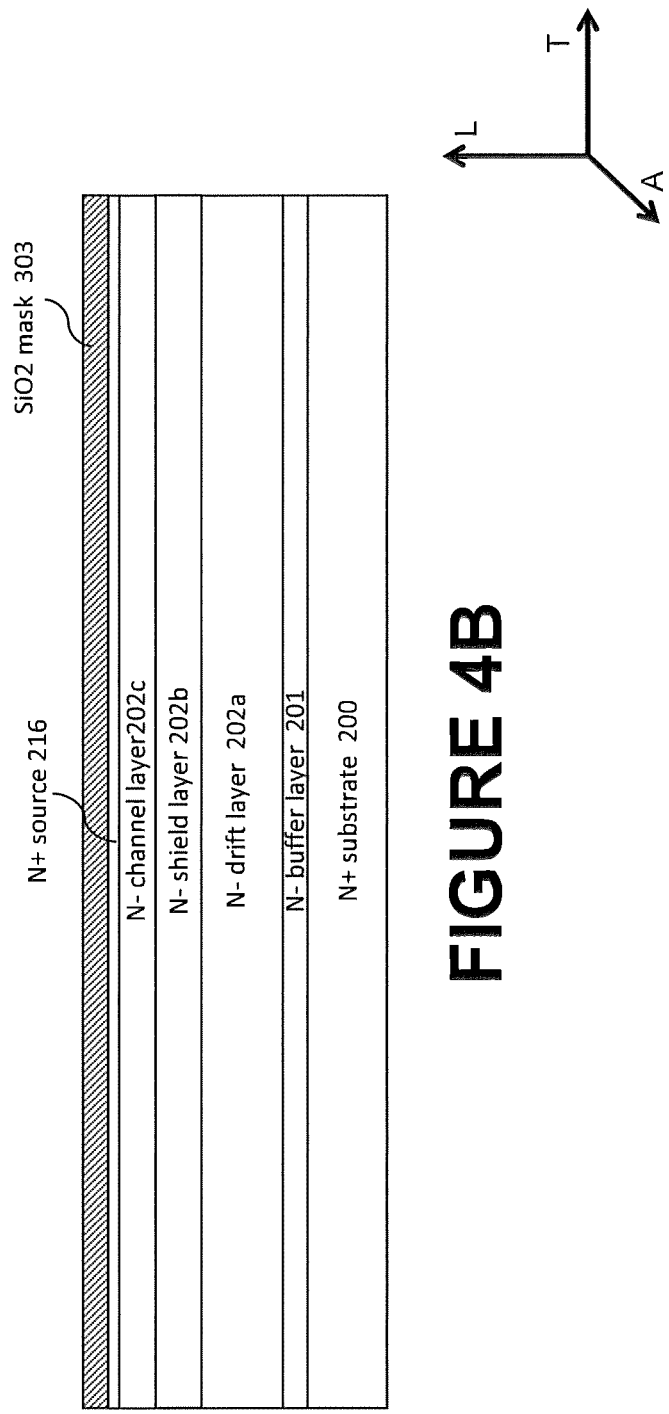
Figure 4C:
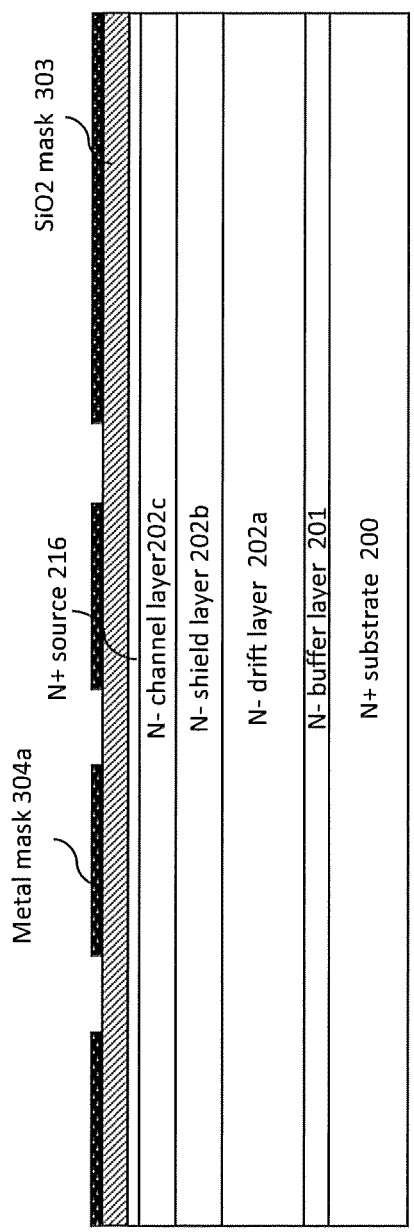
Figure 4C:
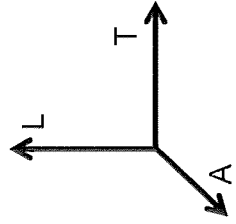
Figure 4D:
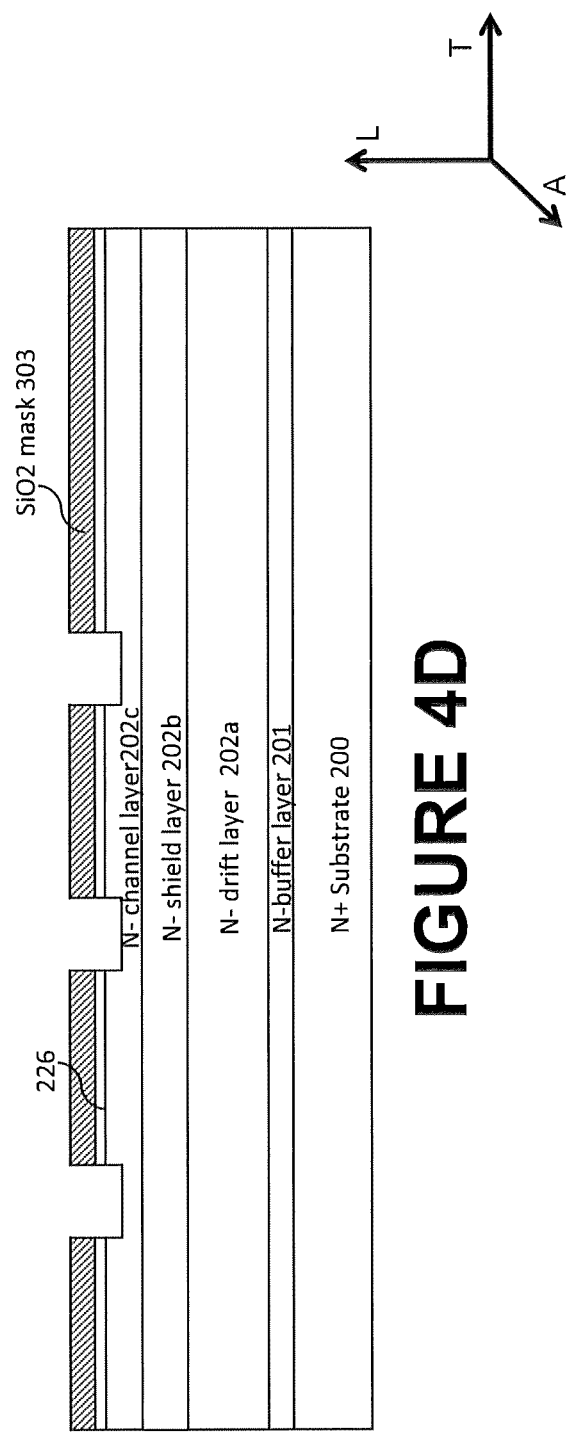

FIGS. 4B-4D illustrate an exemplary process for the formation of the composite oxide or $SiO_2$ mask 303 and metal mask 304a (hardmask) by deposition and lithography, followed by the oxide and shallow trench etch. FIG. 4B illustrates an exemplary oxide deposition (i.e. implant anneal in case of implanted n+). FIG. 4C illustrates an exemplary first etch mask. FIG. 4D illustrates first trench etch and a mesa 226 as described in FIG. 2A.

Figure 4E:
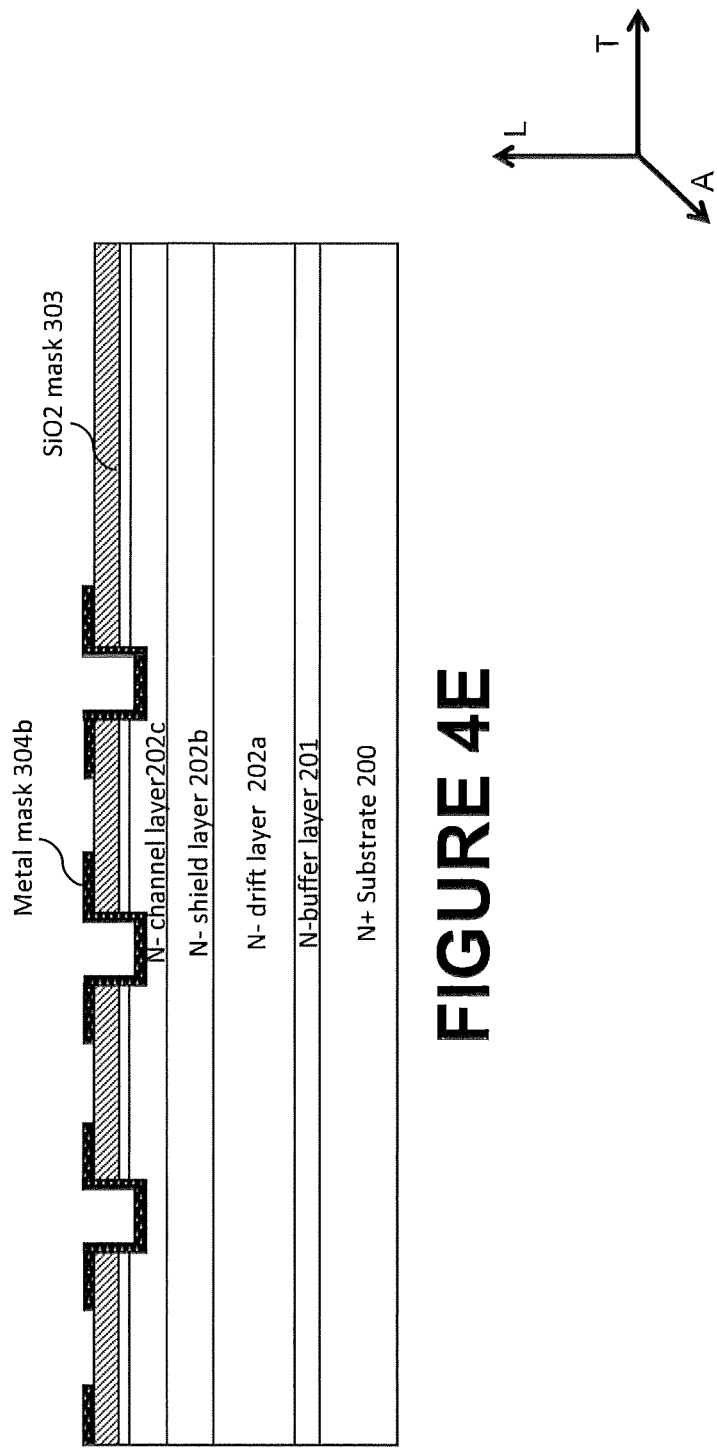

FIG. 4E illustrates an exemplary the second metal deposition, such as metal mask 304b and patterning. FIG. 4F illustrates an exemplary second etch mask 304b.

FIG. 4F shows an exemplary oxide and deeper trench etch using this second etch metal mask 304b (hardmask), followed by metal stripping using techniques such as wet etching that do not affect the oxide of material such as Silicon Carbide. FIG. 4F illustrates an exemplary second trench etch. Note the formation of alternating shallow and deep trenches in the active area 320 and the wide etched region at the deeper level for the termination area 321.

Figure 4G:
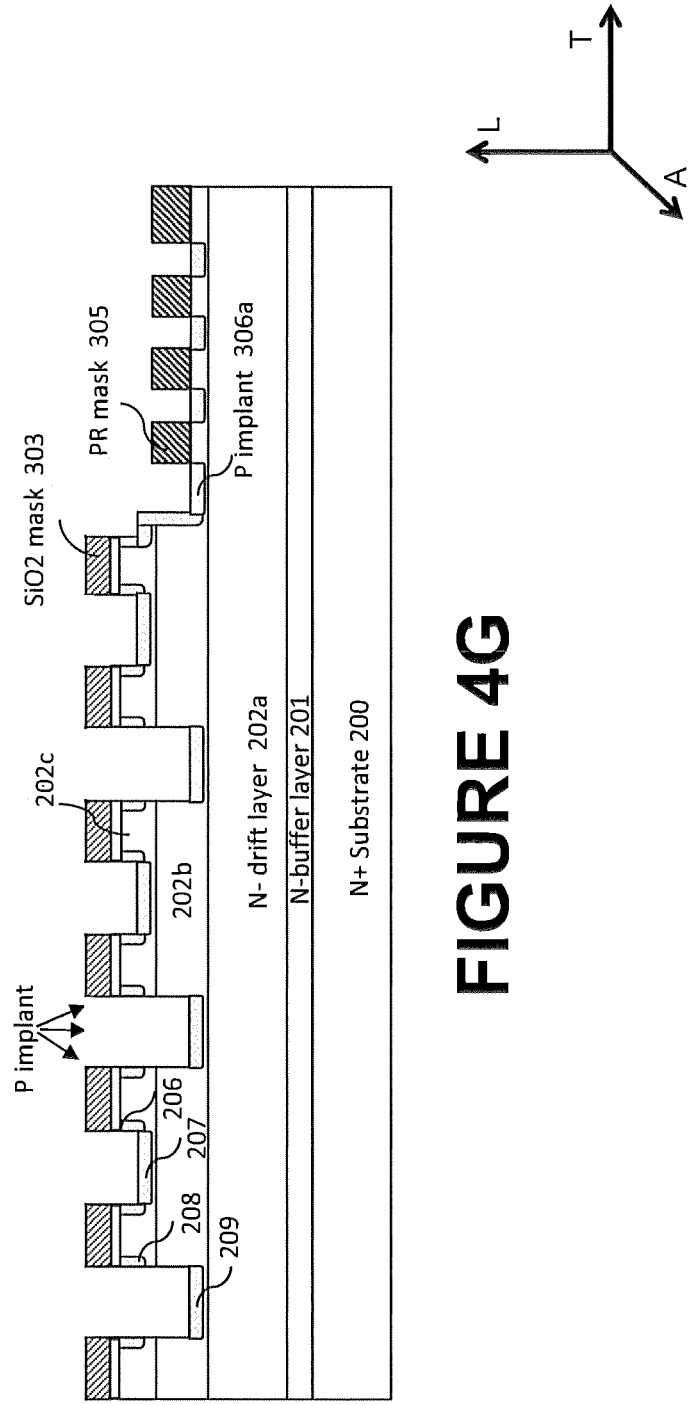

FIG. 4G illustrates an exemplary structure with the masked pattern for the guard rings in the termination area 321, with all the resist cleared from the active area 320. FIG. 4G illustrates a gate implant. The vertical and tilted p-implants regions around the gate trench 203, and the shield trench 204 such as implanted regions 206, 207, 208, 209 in the side walls 217a, 217b, 218a, 218b of the gate trench(es) 203 and shield trench (es) 204 and also P implant 306a regions (also known as guard ring implants) are then performed, and the resist stripped. In the example, the implants are then activated as described in the previous exemplary process, and a thermal oxide grown to improve surface behavior.

Figure 4H:
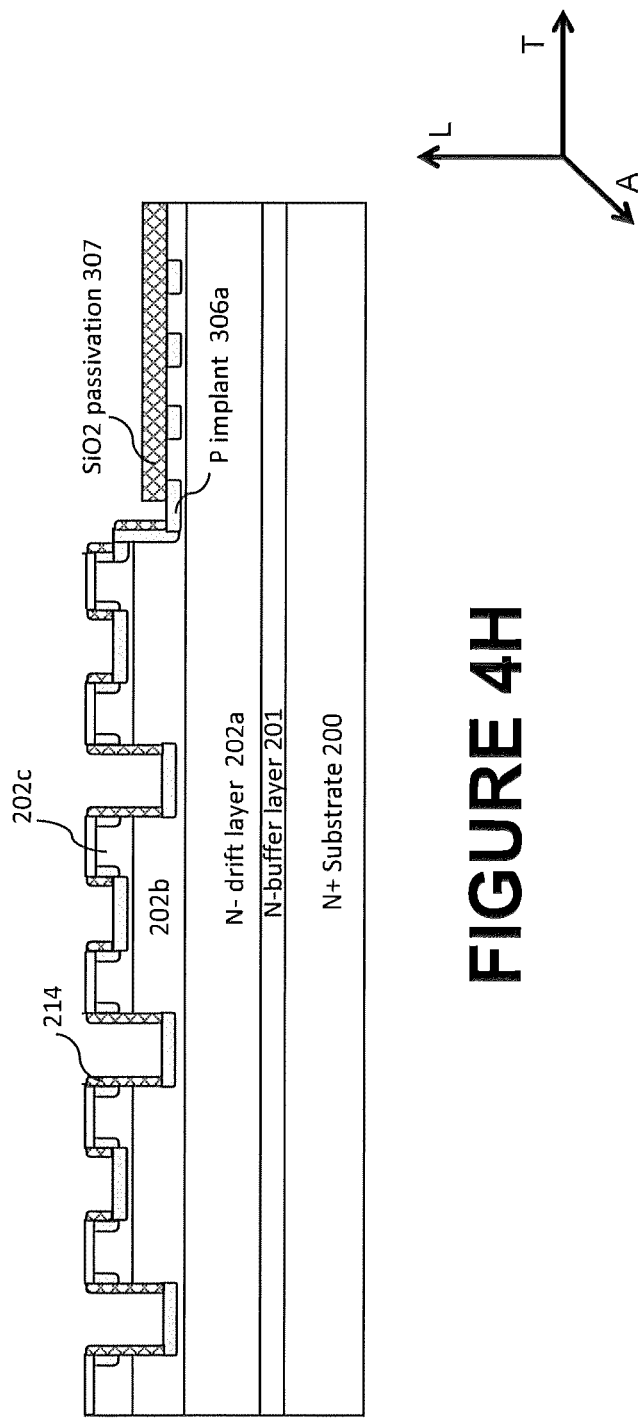

FIG. 4H illustrates an exemplary wafer after deposition of Silicon dioxide (or other dielectric) 307 and etch back with a mask to protect the termination area 321. FIG. 4H further illustrates passivation and ohmic contact windows. This leaves the dielectric 307 (such as the $SiO_2$ passivation 307) over the termination area 321, while forming spacers 214 (such as the dielectric spacers) in the active area 320 trenches. The mask is referred to as the ohmic contact mask, since it leaves open areas where the silicided contacts will subsequently be formed.

Figure 4I:
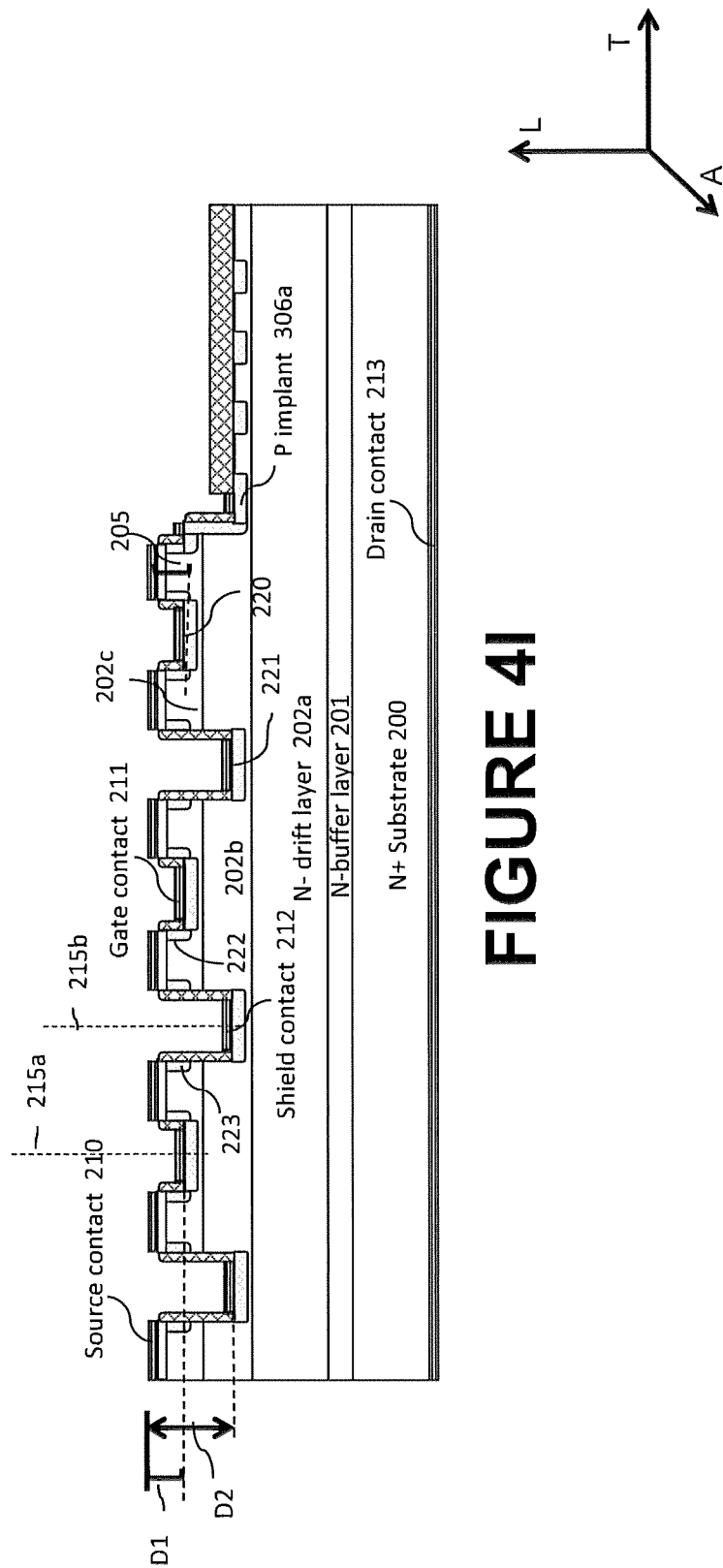

FIG. 4I illustrated an exemplary formation of ohmic contacts. FIG. 4I illustrates the wafer after the deposition of the ohmic contact metal (e.g. Nickel), formation of the silicide by techniques such as appropriate annealing, and removal of the excess metal. As shown in FIG. 4I, ohmic contacts such as gate 211, source 210, shield 212 and shield pickup contact regions 501 (FIG. 5A), and drain 213 contacts are formed. In this example, in order to form the drain contact 213 with the same anneal, the backside films are first stripped with the frontside protected by a photoresist, a layer of material such as Nickel is deposited on the back, the protective resist is removed, and then both the top and bottom surfaces are subjected to a single anneal.

Figure 4J:
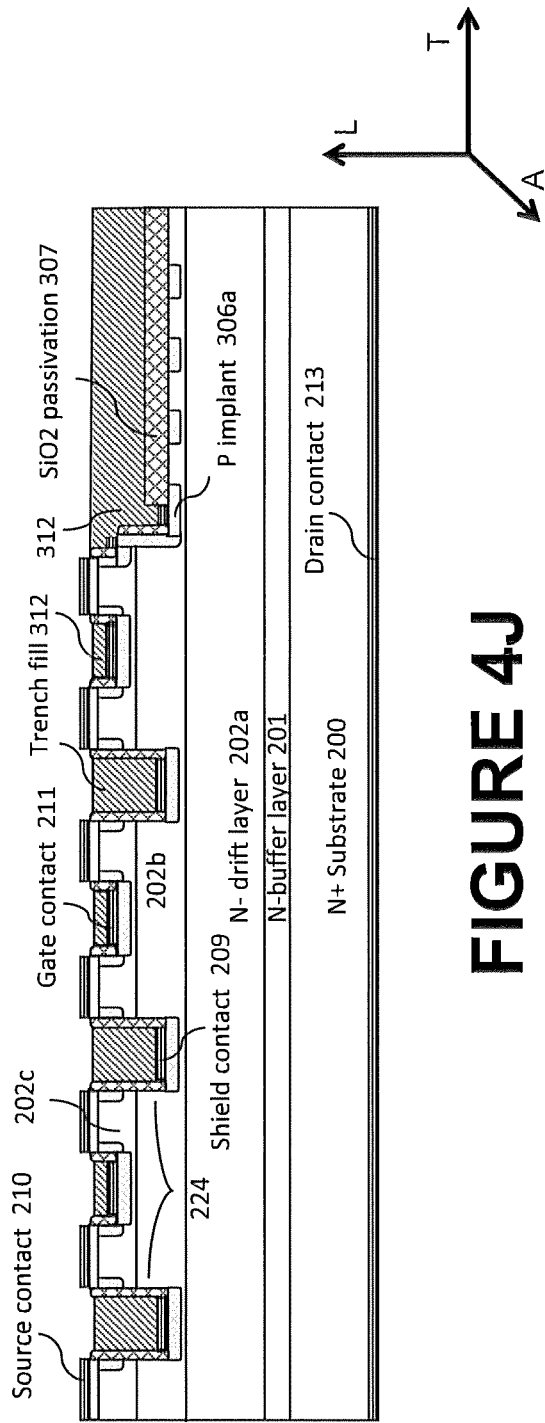

FIG. 4J illustrates an exemplary trench fill. As shown in FIG. 4J, the trenches are filled and the structure is planarized with a mask such as trench fill 312 used to preserve thick dielectric 307 over the passivation areas. At this stage, there may be, for example, two options for connecting the shield to source potential.

Figure 4K:
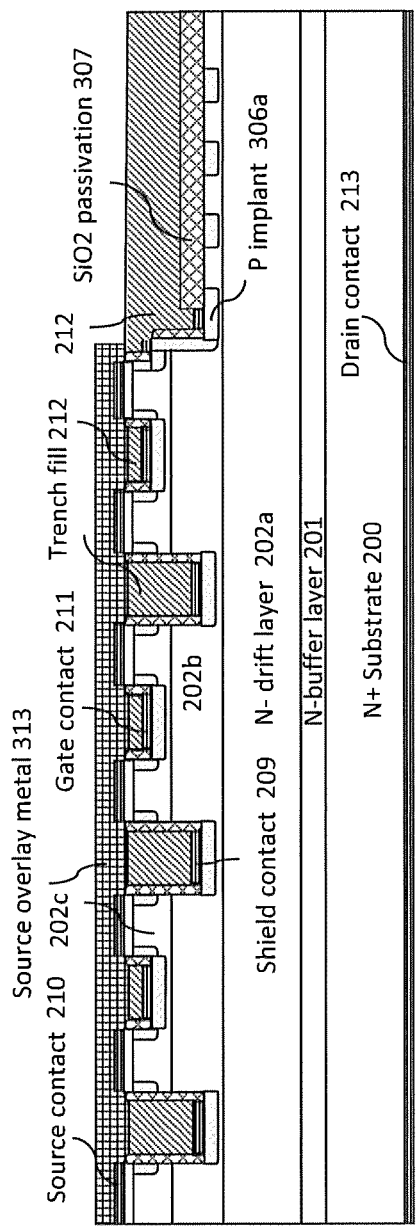
Figure 4K:
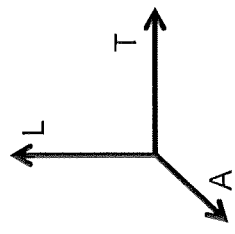

FIG. 4K illustrates a first exemplary process flow option with shield connected to the source at device edge and source metal overlay. FIG. 4K shows where the connection between the shield and source occurs at the device edge. Both the shallow and deep trench are filled by the same trench fill technique as described elsewhere in this disclosure. In this example, a separate mask is used to etch the trench fill dielectric in a location not shown in the figure, to allow the source overlay metal 313 to connect the shield to the source.

Figure 4L:
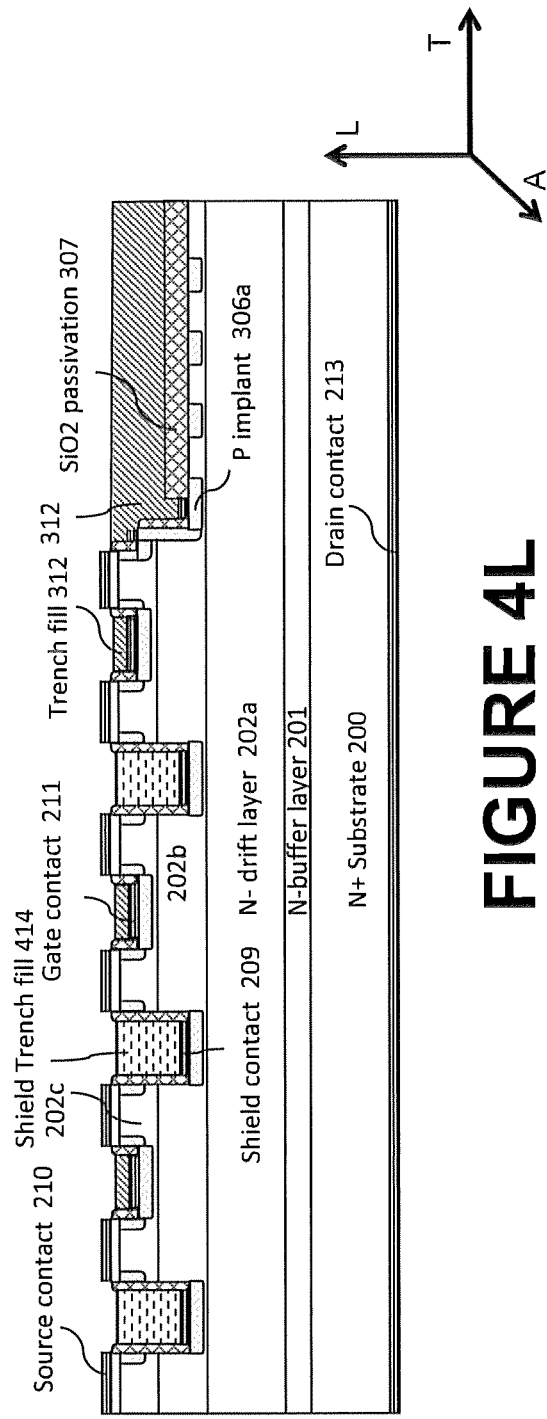

FIG. 4L illustrates a second exemplary process flow option with shield connected to the source at each unit cell and shield trench metal fill. FIG. 4L shows a different exemplary process where a mask is used to remove the trench fill material from the deeper trenches. In this example, then these trenches are refilled to a metal 414 (or a shield trench fill 414) such as CVD Tungsten, while the gate trenches remain filled with dielectric to ensure gate-source isolation.

Figure 4M:
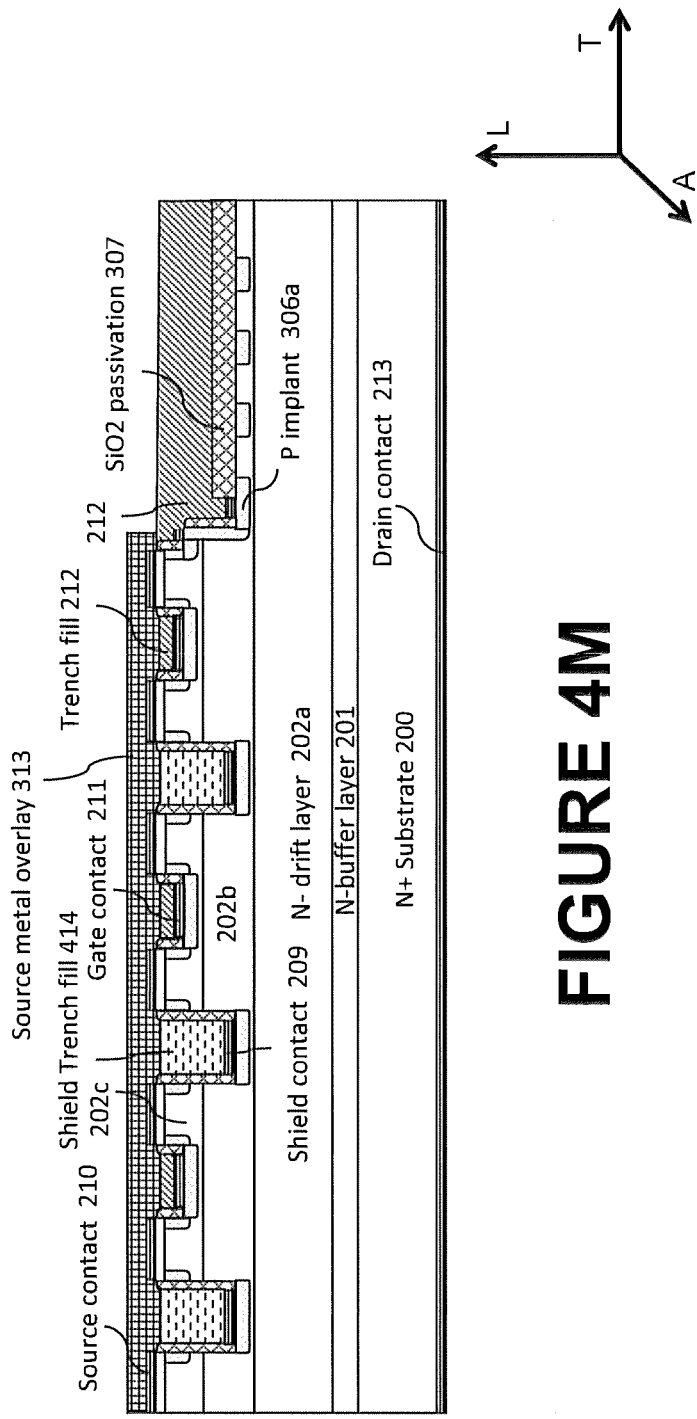

FIG. 4M illustrates the second exemplary process flow option with shield connected to the source at each unit cell and metal overlay. In this example, the source overlay metal is then patterned, as shown in FIG. 4M, allowing the formation of shield-source shorts at the unit cell level. It may be also possible to use a mask to simply etch the trench fill and spacer material fully or partially in the deeper trench, so that when the trench is filled during overlay metal deposition, a shield to source short occurs locally in every cell.

Figure 5A:
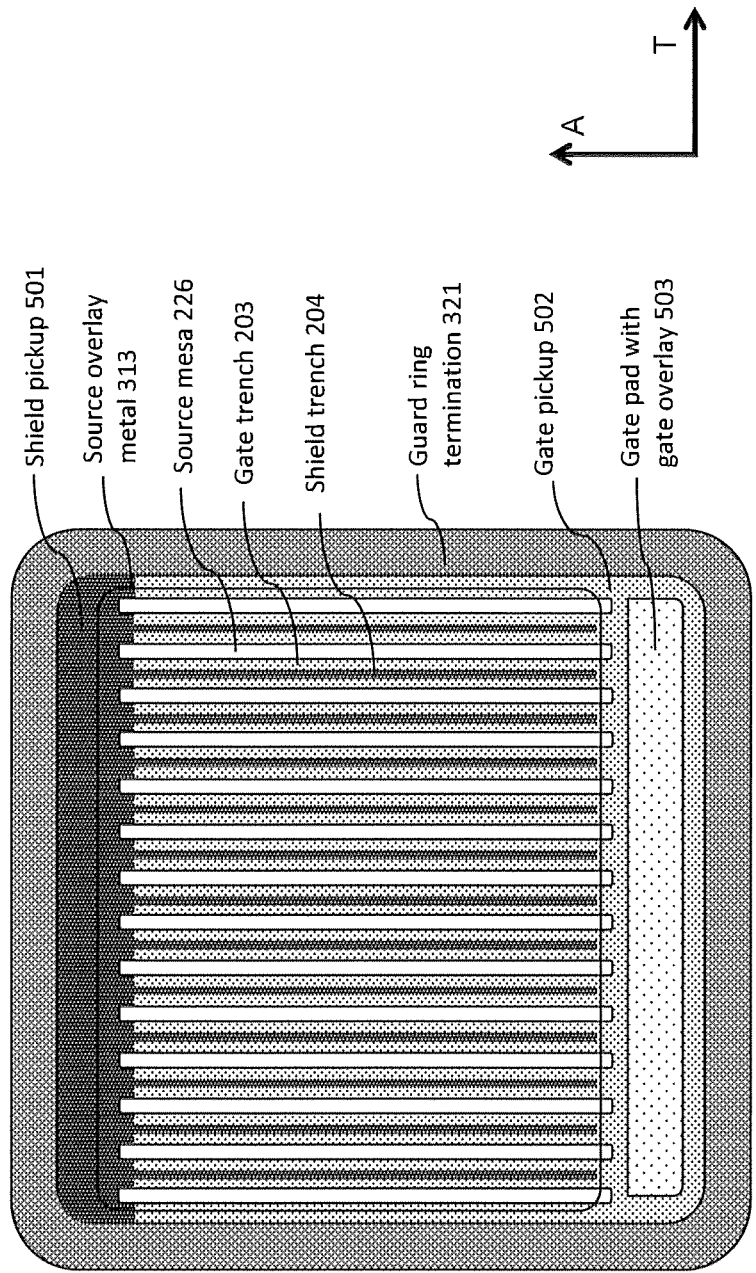
FIGS. 5A-5E illustrate exemplary layout techniques for implementing the trench shielded vertical JFET.

FIG. 5A illustrates an exemplary layout technique for trench shield VJFET with common-center-line gate and shield trenches, and shield connected to the source. FIG. 5A shows an exemplary layout technique for the trench shielded VJFET shown and described in connection with, for example, FIGS. 2A and 2B, where the gate and shield trenches have a common center, for the case of a simple stripe layout. The gate trenches 203, shield trenches 204 and source mesa 226 form an active cell array. The guard ring termination area 321 forms a ring around the device active cell array. The details of the individual guard rings within 321 are not shown, but the first guard ring closest to the active area is connected to the source shield potential. The shield pickup 501, for example, is shown at the top of the cell array, where a wide p+ region is formed, and the trench fill dielectric is etched off, so the source overlay metal 313 connects the source mesas to the shield. On the other side of the device, the gate trenches terminate in a wide area where the gate p+ region is formed, and a large area contact is opened, allowing formation of the gate pickup area 502 and the gate pad 503. The gate pad 503 may also have metal overlay in order, for example, to provide wire bonding capabilities. In this example, the gate pickup 502/gate pad region 503 is isolated from the guard ring termination by one or more floating guard rings, appropriately spaced to provide voltage isolation in excess of the gate-source voltage rating of the device.

Figure 5B:
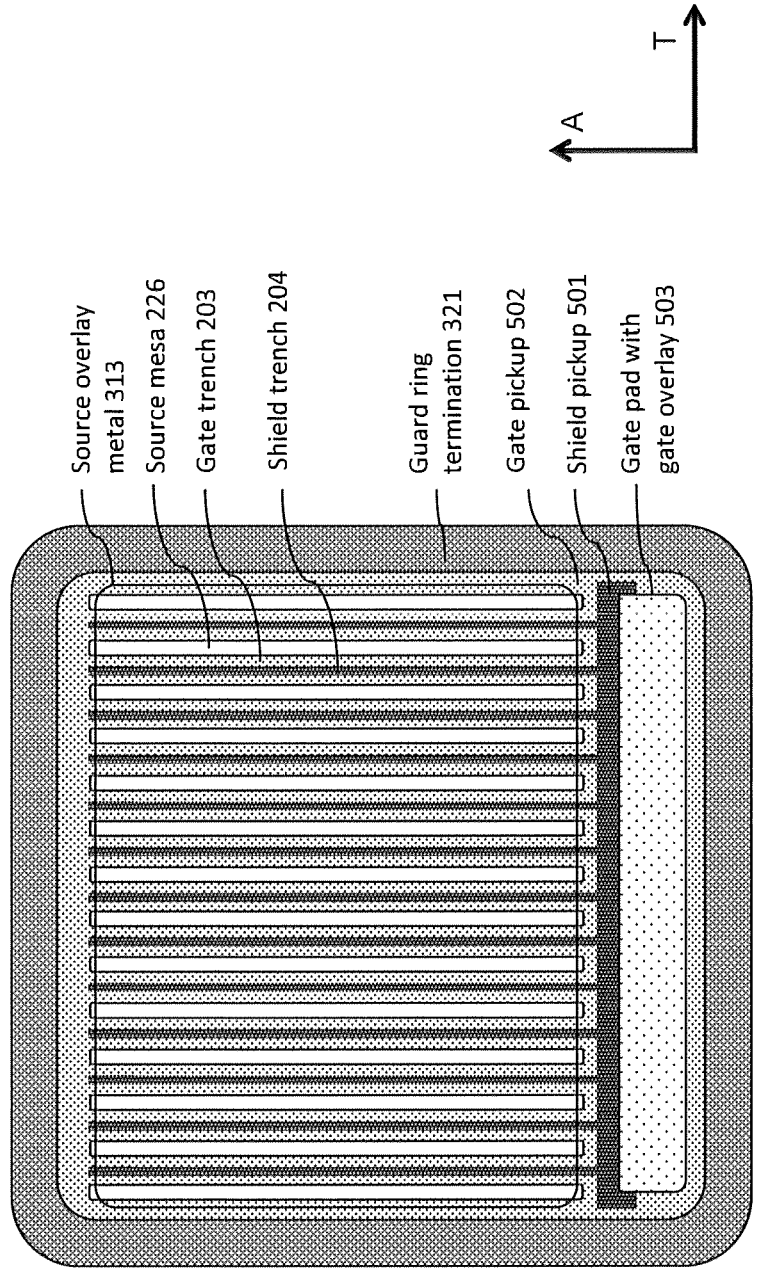

FIG. 5B illustrates an exemplary layout technique for trench shield VJFET with common-center-line gate and shield trenches, and shield connected to the gate. FIG. 5B shows another exemplary layout technique for the trench shielded VJFET of structure illustrated in FIG. 2B, where the gate and shield trenches have a common center, for the case of a simple stripe layout. The gate trenches 203, shield trenches 204 and source mesa 226 form an active cell array. In this example, the guard ring termination area 321 forms a ring around the device active cell array. The details of the individual guard rings within 321 are not shown, but the first guard ring closest to the active area is connected to the source shield potential. The shield pickup 501, for example, is shown on the same side as the gate pickup 502. In this instance, the shield can be easily shorted to gate potential.

Figure 5C:
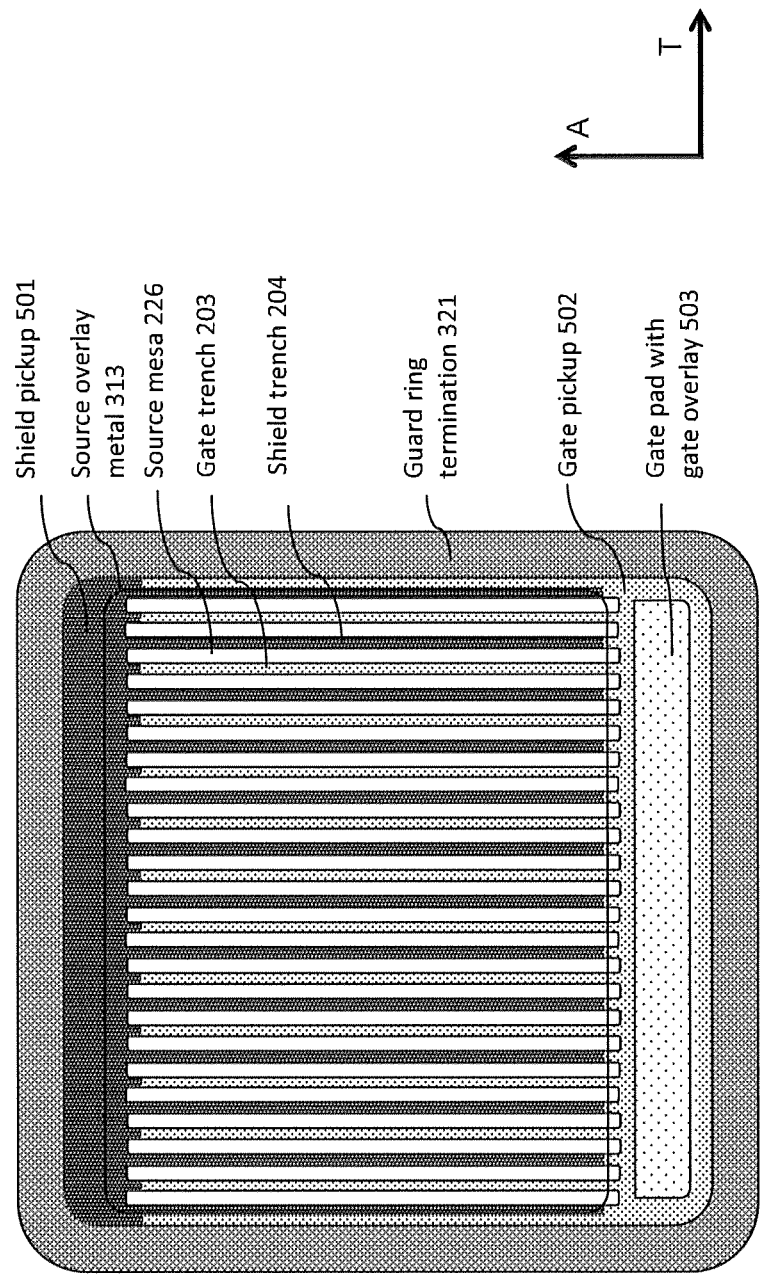

FIG. 5C illustrates an exemplary layout technique for trench shield VJFET without common-center-line gate and shield trenches, and shield connected to the source. FIG. 5C shows an exemplary layout technique for the trench shielded VJFET of structure illustrated in FIG. 2C, where the gate and shield trenches have staggered centerlines 215a, 215b, for the case of a simple stripe layout. The gate trenches 203, shield trenches 204 and source mesa 226 form an active cell array. In this example, the guard ring termination area 321 forms a ring around the device active cell array. The details of the individual guard rings within 321 are not shown, but the first guard ring closest to the active area is connected to the source shield potential. The shield pickup 501, for example, is shown at the top of the cell array, where a wide p+ region is formed, and the trench fill dielectric is etched off, so the source overlay metal 313 connects the source mesas to the shield. On the other side of the device, the gate trenches terminate in a wide area where the gate p+ region is formed, and a large area contact is opened, allowing formation of the gate pad 503. This region is isolated from the guard ring termination by one or more floating guard rings, appropriately spaced to provide voltage isolation in excess of the gate-source voltage rating of the device. For a configuration where some shield trench 204 implanted sidewall regions 208 need to be connected to the source, a careful design of the source pickup region 501 and the wafer rotation angles during tilted implantation are needed in order to connect desired implanted sidewall regions 208 to the source potential. For example, by using gate and shield mesas with different length (along direction A) and appropriate wafer rotation angle during implantation, the shadowing effect of neighboring mesas can be removed to allow the implanted shield sidewall regions 208 to connect to the end of the shield trench along direction A. Alternatively, an additional photomask may be used to remove the spacers 214 on some shield trench sidewalls 218a, so that the source contacts 210 metal will also connect to some implanted regions 208.

Figure 5D:
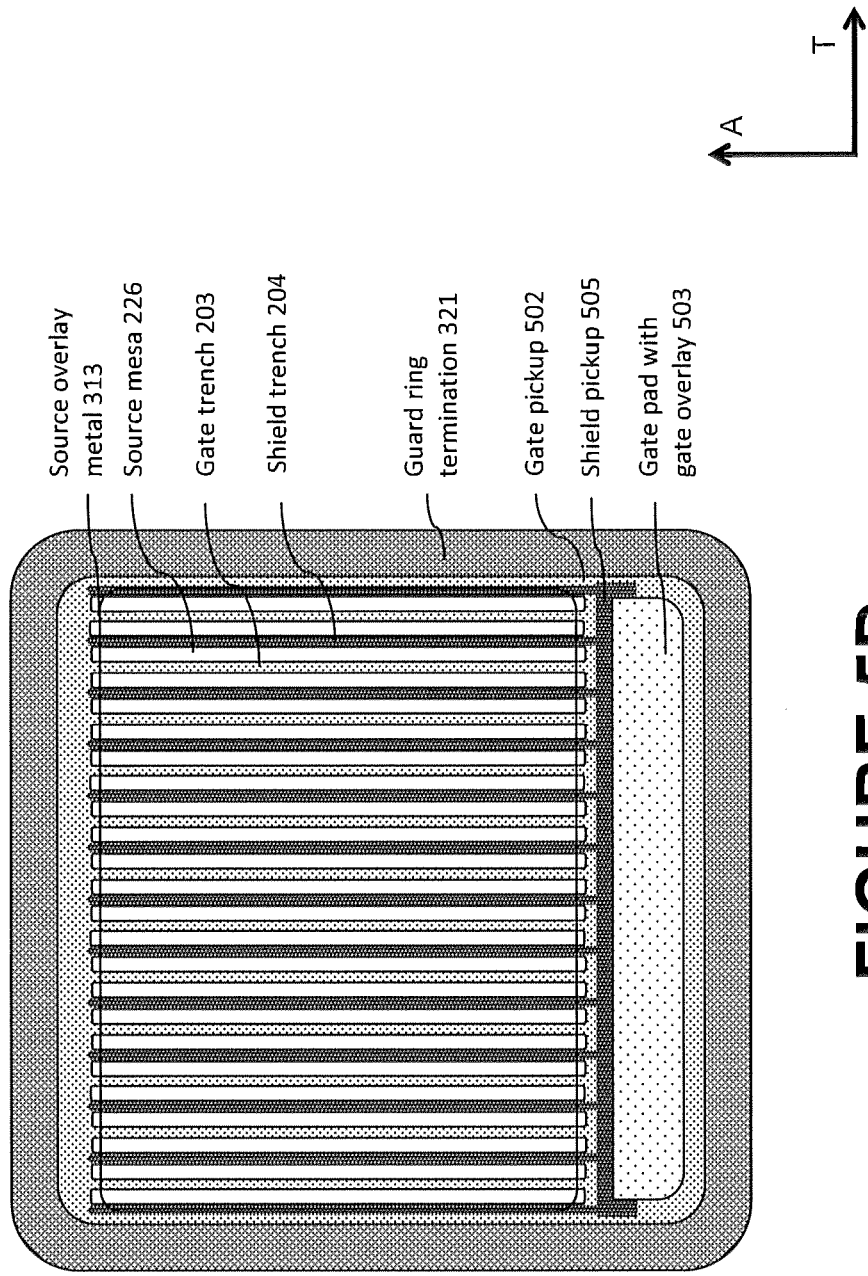

FIG. 5D illustrates an exemplary layout technique for trench shield VJFET without common-center-line gate and shield trenches, and shield connected to the gate. FIG. 5D shows another exemplary layout technique for the trench shielded VJFET of structure illustrated in FIG. 2C, where the gate and shield trenches do not have a common center, for the case of a simple stripe layout. The gate trenches 203, shield trenches 204 and source mesa 226 form an active cell array. In this example, the guard ring termination area 321 forms a ring around the device active cell array. The details of the individual guard rings within 321 are not shown, but the first guard ring closest to the active area is connected to the source shield potential. The shield pickup 501, for example, is shown on the same side as the gate pickup 502. In this instance, the shield can be easily shorted to gate potential.

Figure 5E:
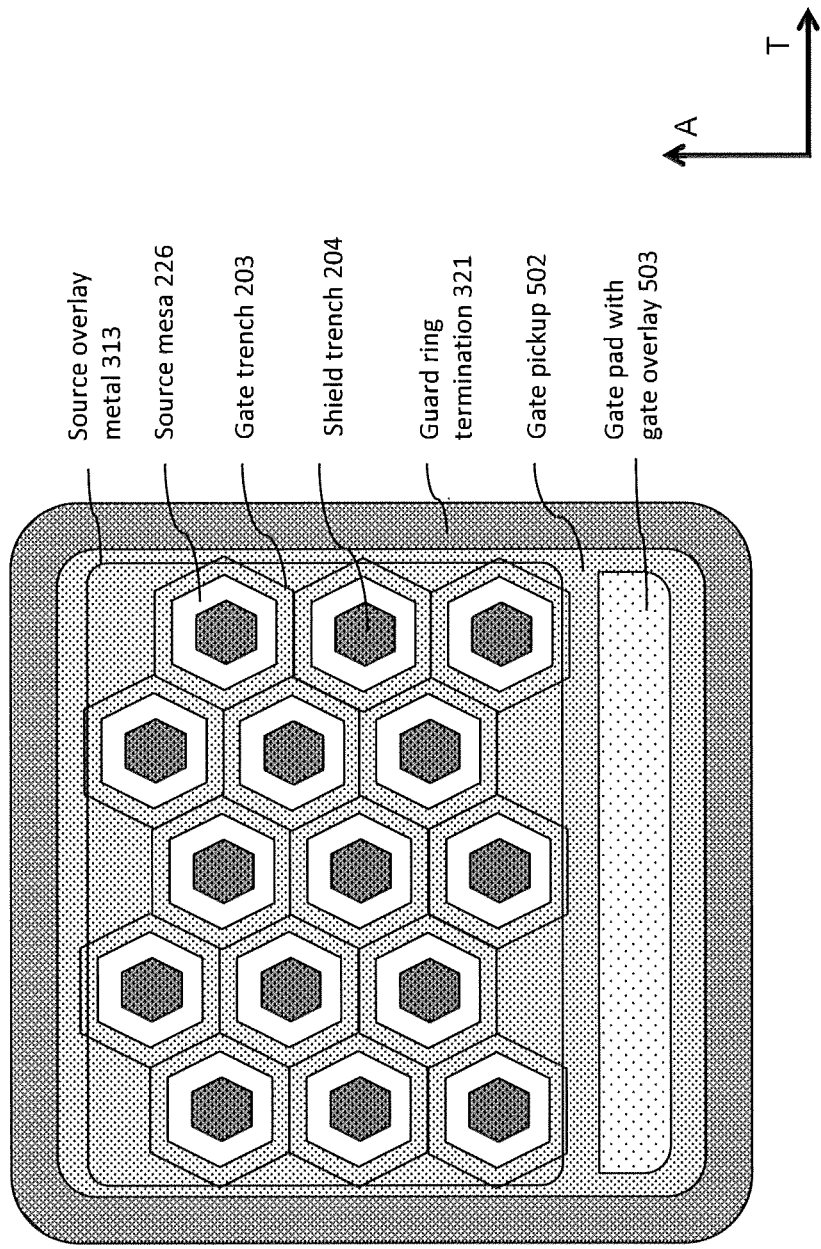

FIG. 5E illustrates an exemplary layout technique for trench shield VJFET without common-center-line gate and shield trenches, and shield connected to the source at unit cell level. FIG. 5E shows an alternate cell array, using hexagonal cells. The inner hexagons are the shield trench 204, and allow local shorting between the shield and source overlay metal, using techniques such as the ones described above. The shield trenches are surrounded as shown by the source mesas 226 and gate trenches 203. In this example, the source overlay metal 313 connects the source mesa tops to the shield trenches everywhere in the active area. The cell array is surrounded by the same termination guard ring region 321. The gate pad, for example, is connected to the gate trench array as shown to form the gate pad 503. This type of cell layout can help increase the channel density of the device, allowing for lower on-resistance per unit area when the channel contribution is high, for e.g., in lower voltage devices.

It should be understood that the tilted implantation and wafer rotation during implantation (as needed in the fabrication corresponding to FIGS. 3G and 4G) may need to be carefully designed to avoid implanting the gate and shield mesa sidewalls perpendicular to axis A (in FIG. 5A and FIG. 5C), as not to create a connection between the shield and the gate regions through the mesa sidewalls by completely implanting the shield trench sidewall all the way to the bottom of the shield trench, for configurations where the shield needs to be connected to the source potential.

What is claimed:

1. A shielded junction field effect transistors (JFET), the shielded JFET comprising:
   a source contact,
   a channel area of a first conductivity type disposed below the source electrode along a first direction, the channel area comprising one or more planar layers of the first conductivity type, the channel area having an upper planar surface and a lower planar surface spaced apart along the first direction;
   a first trench, the first trench having:
   a first bottom surface located in between the upper planar surface and the lower planar surface along the first direction, the first bottom surface extending along the first direction,
   a first depth that extends a first distance into the channel area from the upper planar surface of the channel layer towards the first bottom surface along the first direction,
   a first center line,
   a first pair of side walls spaced apart from one another along a second direction that is perpendicular to the first direction, the first pair of side walls extending from the first bottom surface of the first trench to the upper planar surface of the channel area;
   a first implanted U-shaped conductivity region of the second conductivity type in the channel area comprising: (1) a first portion extending along the bottom surface of the first trench; and (2) a second portion extending from the first bottom surface of the first trench to the upper planar surface of the channel area along each of the pair of side walls; and
   a gate contact disposed in the first trench and adjacent to the first bottom surface of the first trench; and
   a second trench, the second trench having:
   a second bottom surface located in between the upper planar surface and the lower planar surface along the first direction, the first bottom surface extending along the first direction,
   a second depth that extends a second distance into the channel area from the upper planar surface of the channel layer towards the second bottom surface along the first direction, the second depth being greater than the first depth;
   a second center line,
   a second pair of side walls spaced apart from one another along the second direction, the second pair of side walls extending (1) from the second bottom surface of the first trench towards the upper planar surface of the channel area and (2) at least partially between the second bottom surface of the second trench and the upper planar surface of the channel area;
   a second implanted U-shaped conductivity region of the second conductivity type in the channel area comprising: (1) a first portion extending along the second bottom surface of the second U-shaped trench; (2) a second portion extending at least partially between the second bottom surface of the second trench and the upper planar surface of the channel area along each of the second pair of side walls; and
   a shield contact disposed adjacent to the second bottom surface of the second trench.

2. The shielded JFET of claim 1, wherein the shield contact is electrically connected to the source contact so as to hold the shield contact at source potential.

3. The shielded JFET of claim 1, wherein the shield contact is electrically connected to the gate contact so as to hold the shield contact at gate potential.

4. The shielded JFET of any of claims 1-3, further comprising:
   a first unimplanted region extending along each of the pair of side walls of the second trench, the first unimplanted portion being disposed between the second bottom surface and the second portion of the second U-shaped conductivity regions of the second trench along the first direction.

5. The shielded JFET of claim 1, wherein the second portion of the second U-shaped conductivity region of the second trench extends from the second bottom surface of the second trench along the entire length of the second pair of side walls in the first direction.

6. The shielded JFET of claim 1, wherein the first centerline is fully aligned with the second centerline.

7. The shielded JFET of claim 1, wherein the second pair of side walls extend between the first bottom surface of the first trench and the second bottom surface of the second trench along the first direction.

8. The shielded JFET of claim 1, wherein the first centerline is spaced a third distance from the second centerline along the second direction.

9. The shielded JFET of claim 1, wherein the first centerline is spaced a fourth distance from the second centerline along the second direction such that the first trench is separate from the second trench.

10. A method of creating a shielded JFET, the method comprising:
    forming a channel area of a first conductivity type disposed below the source electrode along a first direction, the channel area comprising one or more planar layers of the first conductivity type, the channel area having an upper planar surface and a lower planar surface spaced apart along the first direction;
    forming a source contact above the channel area along a first direction,
    forming a first trench, the first trench having:
    a first bottom surface located in between the upper planar surface and the lower planar surface along the first direction, the first bottom surface extending along the first direction,
    a first depth that extends a first distance into the channel area from the upper planar surface of the channel layer towards the first bottom surface along the first direction,
    a first center line,
    a first pair of side walls spaced apart from one another along a second direction that is perpendicular to the first direction, the first pair of side walls extending from the first bottom surface of the first trench to the upper planar surface of the channel area;
    forming a first implanted U-shaped conductivity region of the second conductivity type in the channel area comprising: (1) a first portion extending along the bottom surface of the first trench; and (2) a second portion extending from the first bottom surface of the first trench to the upper planar surface of the channel area along each of the pair of side walls; and
    forming a gate contact disposed in the first trench and adjacent to the first bottom surface of the first trench; and
    forming a second trench, the second trench having:
    a second bottom surface located in between the upper planar surface and the lower planar surface along the first direction, the first bottom surface extending along the first direction, a second depth that extends a second distance into the channel area from the upper planar surface of the channel layer towards the second bottom surface along the first direction, the second depth being greater than the first depth;

a second center line, a second pair of side walls spaced apart from one another along the second direction, the second pair of side walls extending (1) from the second bottom surface of the first trench towards the upper planar surface of the channel area and (2) at least partially between the second bottom surface of the second trench and the upper planar surface of the channel area;

forming a second implanted U-shaped conductivity region of the second conductivity type in the channel area comprising: (1) a first portion extending along the second bottom surface of the second U-shaped trench; (2) a second portion extending at least partially between the second bottom surface of the second trench and the upper planar surface of the channel area along each of the second pair of side walls; and forming a shield contact disposed adjacent to the second bottom surface of the second trench.

11. The method of claim 10, wherein the shield contact is electrically connected to the source contact so as to hold the shield contact at source potential.

12. The method of claim 10, wherein the shield contact is electrically connected to the gate contact so as to hold the shield contact at gate potential.

13. The method of claim 10, wherein the second portion of the second U-shaped conductivity region of the second trench extends from the second bottom surface of the second trench along the entire length of the second pair of side walls in the first direction.

14. The method of claim 10, wherein the first centerline is fully aligned with the second centerline.

15. The method of claim 10, wherein the second pair of side walls extend between the first bottom surface of the first trench and the second bottom surface of the second trench along the first direction.

16. The method of claim 10, wherein the first centerline is spaced a third distance from the second centerline along the second direction.

17. The method of claim 10, wherein the first centerline is spaced a fourth distance from the second centerline along the second direction such that the first trench is separate from the second trench.

18. The method of claim 10, further comprising:
preventing ion implantation in a first unimplanted region extending along each of the second pair of side walls of the second trench, the first unimplanted portion being disposed between the second bottom surface and the second portion of the second U-shaped conductivity regions of the second trench along the first direction.

19. The method of claim 18, wherein the step of preventing further includes depositing a dielectric on each of the second pair of side walls adjacent to the first unimplanted region.

20. The method of claim 18, wherein the step of preventing further includes performing thermo oxidation.

21. The method of claim 14, further comprising:
preventing ion implantation in a first unimplanted region extending along each of the second pair of side walls of the second trench, the first unimplanted portion being disposed between the second bottom surface and the second portion of the second U-shaped conductivity regions of the second trench along the first direction.

22. The method of claim 21, wherein the step of preventing further includes depositing a dielectric on each of the second pair of side walls adjacent to the first unimplanted region.

23. The method of claim 21, wherein the step of preventing further includes performing thermo oxidation.

* * * * *